United States Patent
Kim

(10) Patent No.: US 10,748,924 B2
(45) Date of Patent: Aug. 18, 2020

(54) VERTICAL MEMORY DEVICES

(71) Applicant: SAMSUNG ELECTRONICS CO., LTD., Suwon-si, Gyeonggi-Do (KR)

(72) Inventor: Jun Hyoung Kim, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/235,122

(22) Filed: Dec. 28, 2018

(65) Prior Publication Data

US 2019/0333932 A1    Oct. 31, 2019

(30) Foreign Application Priority Data

Apr. 25, 2018 (KR) .................. 10-2018-0047752

(51) Int. Cl.
| | | |
|---|---|---|
| *H01L 27/11582* | (2017.01) | |
| *H01L 27/11573* | (2017.01) | |
| *H01L 21/768* | (2006.01) | |
| *H01L 23/522* | (2006.01) | |
| *H01L 27/11565* | (2017.01) | |

(52) U.S. Cl.
CPC .. *H01L 27/11582* (2013.01); *H01L 21/76804* (2013.01); *H01L 23/5226* (2013.01); *H01L 27/11565* (2013.01); *H01L 27/11573* (2013.01)

(58) Field of Classification Search
CPC ..................... H01L 27/11582; H01L 27/11573
USPC .................................................. 257/324, 329
See application file for complete search history.

(56) References Cited

U.S. PATENT DOCUMENTS

| | | | |
|---|---|---|---|
| 6,660,612 B1 | 12/2003 | Chang et al. | |
| 8,394,716 B2* | 3/2013 | Hwang | H01L 27/11551 257/315 |
| 8,871,591 B2 | 10/2014 | Kwon et al. | |
| 9,018,696 B2* | 4/2015 | Wada | H01L 21/76808 257/314 |
| 9,208,885 B2 | 12/2015 | Hwang et al. | |
| 9,337,198 B2 | 5/2016 | Kwon et al. | |
| 9,716,104 B2 | 7/2017 | Kim et al. | |
| 10,453,860 B1* | 10/2019 | Xiao | H01L 27/11548 |
| 2013/0334589 A1* | 12/2013 | Ahn | H01L 29/7926 257/324 |

(Continued)

FOREIGN PATENT DOCUMENTS

KR    1020170134039    12/2017

*Primary Examiner* — David Vu
*Assistant Examiner* — Brandon C Fox
(74) *Attorney, Agent, or Firm* — F. Chau & Associates, LLC

(57) ABSTRACT

A vertical memory device includes first gate electrodes spaced apart from each other under a substrate in a first direction substantially perpendicular to a lower surface of the substrate, the first gate electrodes being arranged to have a staircase shape including steps of which extension lengths in a second direction substantially parallel to the lower surface of the substrate gradually increase from an uppermost level toward a lowermost level, second gate electrodes spaced apart from each other under the first gate electrodes in the first direction, the second gate electrodes being arranged to have a staircase shape including steps of which extension lengths in the second direction gradually decrease from an uppermost level toward a lowermost level and a channel extending through the first and second gate electrodes in the first direction.

20 Claims, 39 Drawing Sheets

(56) References Cited

U.S. PATENT DOCUMENTS

| | | | |
|---|---|---|---|
| 2014/0061750 A1* | 3/2014 | Kwon | H01L 27/1052 257/314 |
| 2014/0191389 A1* | 7/2014 | Lee | H01L 21/7685 257/734 |
| 2015/0179564 A1* | 6/2015 | Lee | H01L 27/11548 257/756 |
| 2015/0287710 A1* | 10/2015 | Yun | H01L 27/1157 257/314 |
| 2016/0358927 A1 | 12/2016 | Nam et al. | |
| 2017/0345843 A1 | 11/2017 | Lee et al. | |

* cited by examiner

VERTICAL MEMORY DEVICES

CROSS-REFERENCE TO RELATED APPLICATION

This application claims priority under 35 U.S.C. § 119 to Korean Patent Application No. 10-2018-0047752, filed on Apr. 25, 2018, in the Korean Intellectual Property Office (KIPO), the contents of which are herein incorporated by reference in their entirety.

TECHNICAL FIELD

Example embodiments of the present inventive concept relate to a vertical memory device.

DISCUSSION OF RELATED ART

In manufacturing a VNAND flash memory device of a cell-over-peri (COP) structure, a peripheral circuit including a driving circuit transistor, a contact plug and a wiring may be formed, and then a cell array may be formed over the peripheral circuit. Accordingly, the cell array may be contaminated by metal components remaining after a process for forming the contact plug and the wiring which are typically made of metals. Also, the characteristics of the contact plug and the wiring including a metal or metals may be deteriorated by a high temperature process for forming the cell array.

SUMMARY

Example embodiments of the present inventive concept provide a vertical memory device having enhanced electrical characteristics.

According to an example embodiment of the present inventive concept, there is provided a vertical memory device. The vertical memory device may include first gate electrodes spaced apart from each other under a substrate in a first direction substantially perpendicular to a lower surface of the substrate, the first gate electrodes being arranged to have a staircase shape including steps of which extension lengths in a second direction substantially parallel to the lower surface of the substrate may gradually increase from an uppermost level toward a lowermost level, second gate electrodes spaced apart from each other under the first gate electrodes in the first direction, the second gate electrodes being arranged to have a staircase shape including steps of which extension lengths in the second direction may gradually decrease from an uppermost level toward a lowermost level, and a channel extending through the first and second gate electrodes in the first direction.

According to an example embodiment of the present inventive concept, there is provided a vertical memory device. The vertical memory device may include first gate electrodes spaced apart from each other under a substrate in a first direction substantially perpendicular to a lower surface of the substrate, second gate electrodes spaced apart from each other under the first gate electrodes in the first direction, a channel extending through the first and second gate electrodes in the first direction, first contact plugs each extending in the first direction and contacting an upper surface of each of the first gate electrodes, respectively, the first contact plugs having extension lengths in the first direction gradually increasing according to an increase of respective distances of the first contact plugs from the channel, and second contact plugs each extending in the first direction and contacting a lower surface of each of the second gate electrodes, respectively, the second contact plugs having extension lengths in the first direction gradually increasing according to an increase of respective distances from the channel.

According to an example embodiment of the present inventive concept, there is provided a vertical memory device. The vertical memory device may include gate electrodes spaced apart from each other under a substrate in a first direction substantially perpendicular to a lower surface of the substrate, the gate electrodes being arranged to have a staircase shape of which extension lengths of the gate electrodes in a second direction substantially parallel to the lower surface of the substrate may gradually decrease from an uppermost level toward a lowermost level, and a lower surface of an end portion in the second direction of at least one of the gate electrodes being lower than lower surfaces of other portions thereof, a channel extending through the gate electrodes in the first direction, the channel having a width gradually increasing from a top toward a bottom thereof, first contact plugs each extending in the first direction to contact a lower surface of each of the gate electrodes, respectively, and having a width gradually increasing from a top toward a bottom thereof, lower wirings electrically connected to the first contact plugs, upper wirings disposed on the substrate, and a second contact plug extending in the first direction to be electrically connected to the upper wirings and the lower wirings, the second contact plug having a width gradually decreasing from a top toward a bottom thereof.

BRIEF DESCRIPTION OF THE DRAWINGS

Example embodiments of the present inventive concept will be more clearly understood from the following detailed description taken in conjunction with the accompanying drawings, in which.

Figure 1:
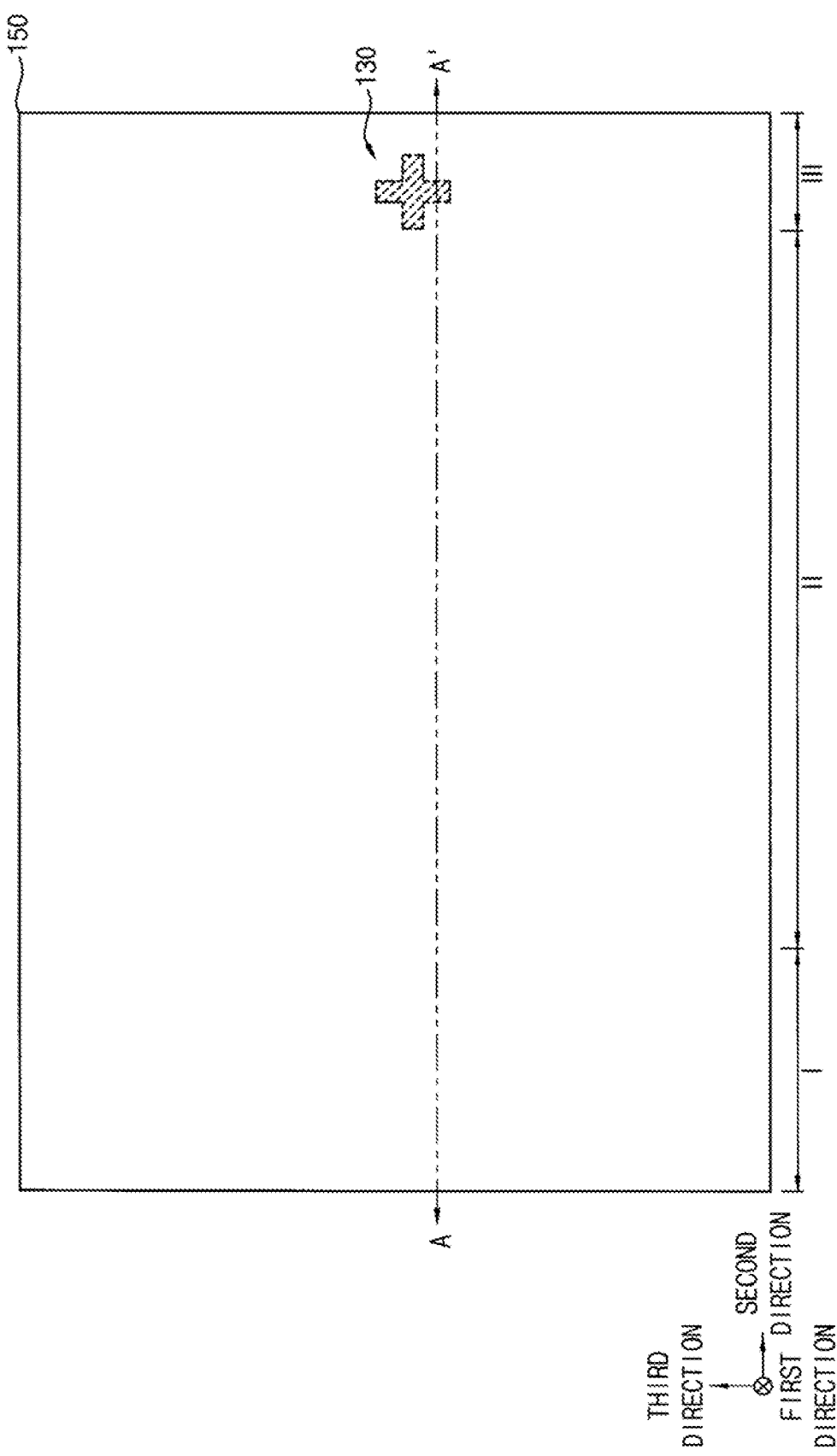
FIGS. 1 to 22 are plan views and cross-sectional views illustrating a method of manufacturing a vertical memory device in accordance with an example embodiment of the present inventive concept.

Since the drawings in FIGS. 1-39 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Vertical memory devices in accordance with example embodiments of the present inventive concept will be described more fully hereinafter with reference to the accompanying drawings.

FIGS. 1 to 22 are plan views and cross-sectional views illustrating a method of manufacturing a vertical memory device in accordance with an example embodiment of the present inventive concept. Specifically, FIGS. 1, 6, 8, 11 and 15 are plan views, and FIGS. 2 to 5, 7, 9 to 10, 12 to 14 and 16 to 22 are cross-sectional views.

FIGS. 2, 3, 4, 5, 7, 9 and 17 to 21 are cross-sectional views taken along lines A-A' of corresponding plan views, respectively, and FIGS. 12 to 14, 16 and 22 are cross-sectional views taken along lines B-B' of corresponding plan views, respectively. FIG. 10 is an enlarged cross-sectional view of region X in FIG. 9.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In an example embodiment of the present inventive concept, the second and third directions may be orthogonal to each other.

Figure 2:
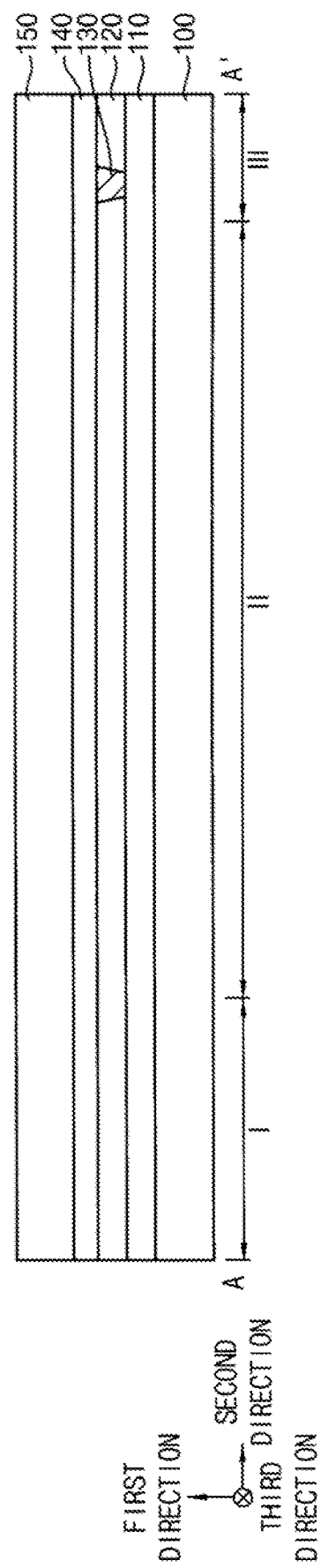

Referring to FIGS. 1 and 2, after forming an align key 130 at an upper portion of the substrate, an insulating buffer layer 140 and a semiconductor layer 150 may be sequentially stacked on the substrate.

The substrate may include first to third regions I, II and III. The first region I may be a cell array region in which a memory cell array may be formed, and the second region II may be a pad region in which gate electrode pads may be formed. The third region III may be a scribe lane region, in which dies or chips may be separated or singulated, surrounding the cell array region. Hereinafter, the first to third regions I, II and III will be used as a concept including not only a portion of the substrate, but also spaces over and below the substrate.

The substrate may include semiconductor materials e.g., silicon (Si), germanium (Ge), silicon-germanium (SiGe), etc., or 111-V compounds e.g., gallium phosphide (GaP), gallium arsenide (GaAs), Gallium Antimonide (GaSb), etc. In an example embodiment of the present inventive concept, the substrate may be a silicon-on-insulator (SOI) substrate or a germanium-on-insulator (GO) substrate.

Hereinafter, an SOI substrate including a first single crystalline silicon layer 100, a buried oxide layer 110 and a second single crystalline silicon layer 120 sequentially stacked will be described, however, the present inventive concept may not be limited thereto. In an example embodiment of the present inventive concept, the second single crystalline silicon layer 120, in which a transistor may be formed, may have a thin thickness of, for example, 2 µm or less, and thus a short channel effect of the transistor may be reduced. In addition, the SOI substrate may also have reduced parasitic capacitance.

The align key 130 may be formed through the second single crystalline silicon layer 120 in the third region III as a single one, or a plurality of align keys 130 may be formed in the third region III. The align key 130 having a cross shape is illustrated in FIG. 1, however, the present inventive concept may not be limited thereto, and may have various other shapes. For example, the shape of the align key 130 may include, for example, an L shape, a V shape, an X shape, a circular shape or a polygonal shape. The align key 130 may include, for example, a metal, however, the present inventive concept may not be limited thereto.

The insulating buffer layer 140 may include an oxide, e.g., silicon oxide ($SiO_2$), and the semiconductor layer 150 may include, for example, polysilicon (Si).

Figure 3:
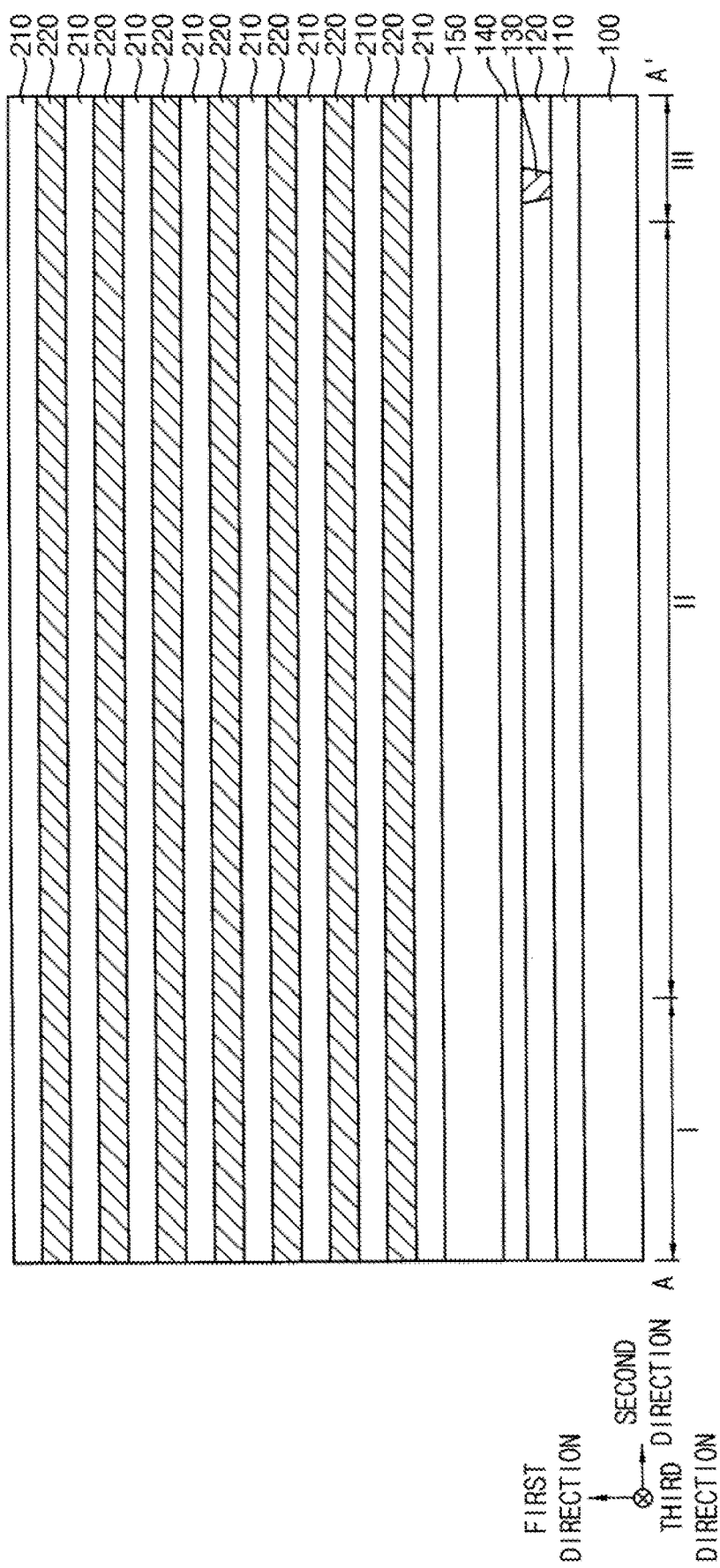

Referring to FIG. 3, a first insulation layer 210 and a sacrificial layer 220 may be alternately and repeatedly stacked on the semiconductor layer 150 which may be a polysilicon (Si) layer. Accordingly, a plurality of the first insulation layers 210 and a plurality of the sacrificial layers 220 may be alternately stacked in the first direction over the insulating buffer layer 140 and the semiconductor layer 150 on the substrate.

The first insulation layer 210 and the sacrificial layer 220 may be formed by a process, e.g., a chemical vapor deposition (CVD) process, a plasma enhanced chemical vapor deposition (PECVD) process, an atomic layer deposition (ALD) process, etc. The first insulation layer 210 may include an oxide, e.g., silicon oxide ($SiO_2$), and the sacrificial layer 220 may include a material having an etching selectivity with respect to the first insulation layer 210, e.g., a nitride such as silicon nitride ($Si_3N_4$).

Figure 4:
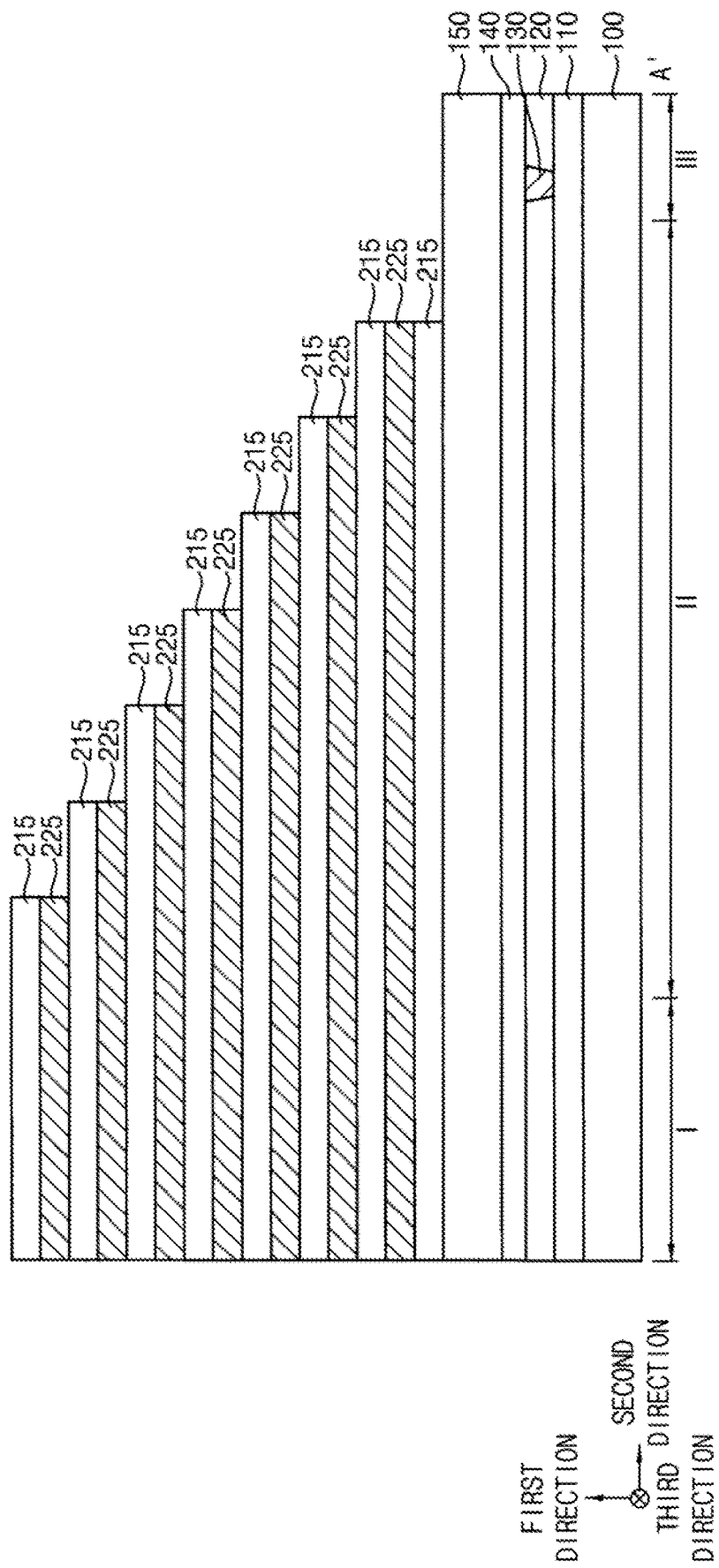

Referring to FIG. 4, a photoresist pattern partially covering an uppermost one of the first insulation layers 210 may be formed on the uppermost one of the first insulation layers 210, and the uppermost one of the first insulation layers 210 and an uppermost one of the sacrificial layers 220 thereunder may be etched using the photoresist pattern as an etching mask. Accordingly, a portion of one of the first insulation layers 210 directly under the uppermost one of the sacrificial layers 220 in the second and third regions II and III may be exposed.

After reducing an area of the photoresist pattern by a given ratio, a trimming process, in which the uppermost one of the first insulation layers 210, the uppermost one of the sacrificial layers 220, the exposed one of the first insulation layers 210 and one of the sacrificial layers 220 thereunder may be etched using the reduced photoresist pattern as an etching mask, may be performed. At this time, the etching of the first insulating and sacrificial layers 210 and 220 and the reducing of the area of the photoresist pattern may be alternately repeated. As the trimming process is repeatedly performed, a mold including a plurality of steps, which may include a first sacrificial pattern 225 and a first insulation pattern 215 sequentially stacked and having a staircase shape, may be formed. Hereinafter, each of the steps may be considered to include not only exposed portions, but also portions covered by upper level steps, and thus may be referred to as an entire portion of the first sacrificial pattern 225 and an entire portion of the first insulation pattern 215 at the same level.

The mold may be formed in the first and second regions I and II. In this case, an exposed portion of each step in the mold may be formed in the second region II. For example, top surfaces of end portions of the first insulation pattern 215 may be exposed in the second region II.

In an example embodiment of the present inventive concept, the steps included in the mold may have lengths extending in each of the second and third directions, which may gradually decrease from a lowermost one toward an uppermost one thereof.

Figure 5:
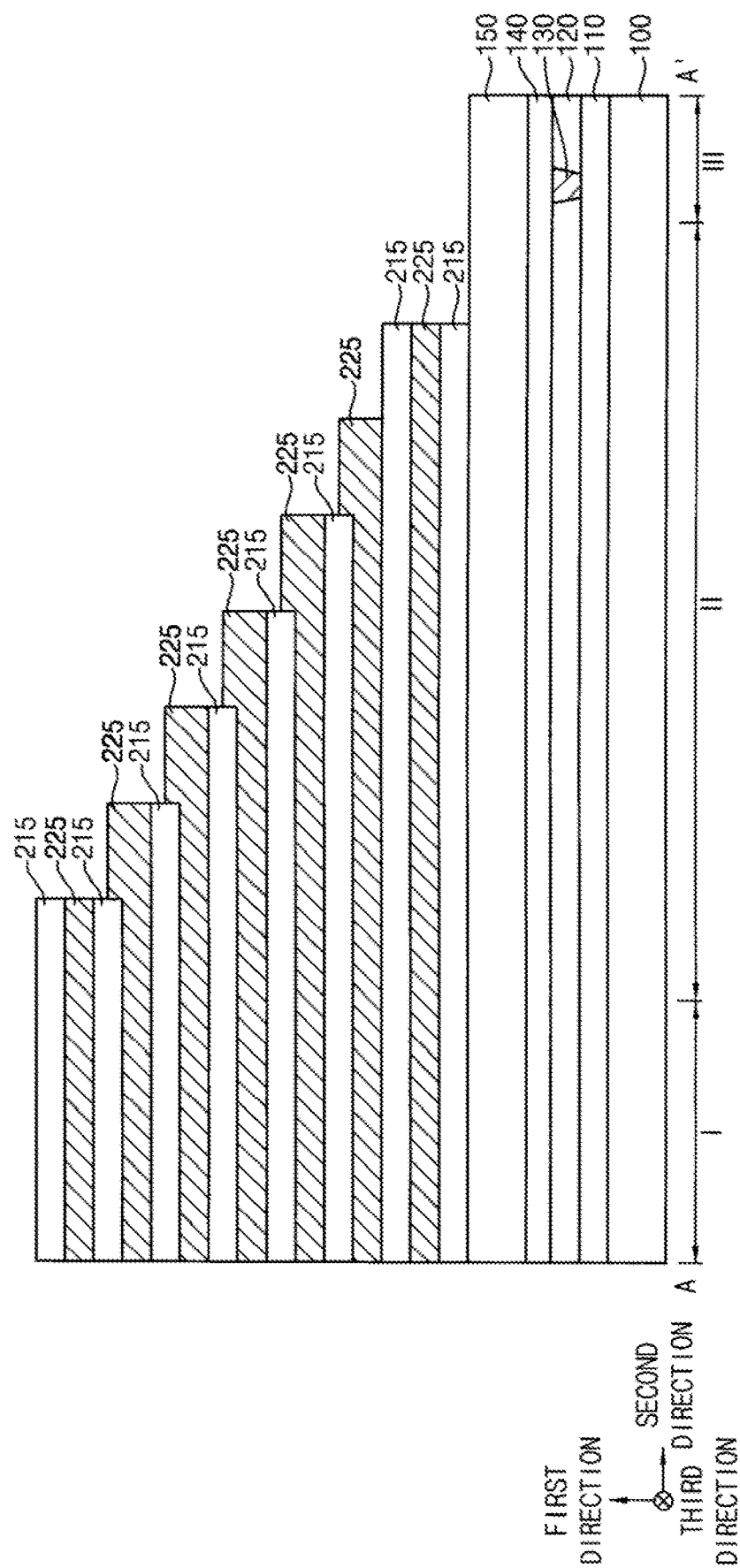

Referring to FIG. 5, a thickness of an end portion in the second direction of at least one of the first sacrificial patterns 225 may be increased.

In an example embodiment of the present inventive concept, an end portion of the first insulation pattern 215 included in an exposed portion of each of the steps may be removed to expose an end portion of the first sacrificial pattern 225 in each of the steps. Then, a layer including a material substantially the same as that of the first sacrificial pattern 225 may be further formed on the first insulation pattern 215 and the exposed end portion of the first sacrificial pattern 225 in each of the steps by a deposition process having a low step coverage characteristic, and an etch back process may be performed thereon, so that the thickness of the end portion in the second direction of each of the first sacrificial patterns 225 may be increased. Accordingly, the end portion in the second direction of each of the first sacrificial patterns 225 in the second region II may have an upper surface higher than those of other portions thereof in the first and second regions I and II.

FIG. 5 shows increased thicknesses of the end portions of all first sacrificial patterns 225 except for a lowermost one and an uppermost one, however, the present inventive concept may not be limited thereto, and for example, the thicknesses of the end portions of all first sacrificial patterns 225 may be increased.

Figure 6:
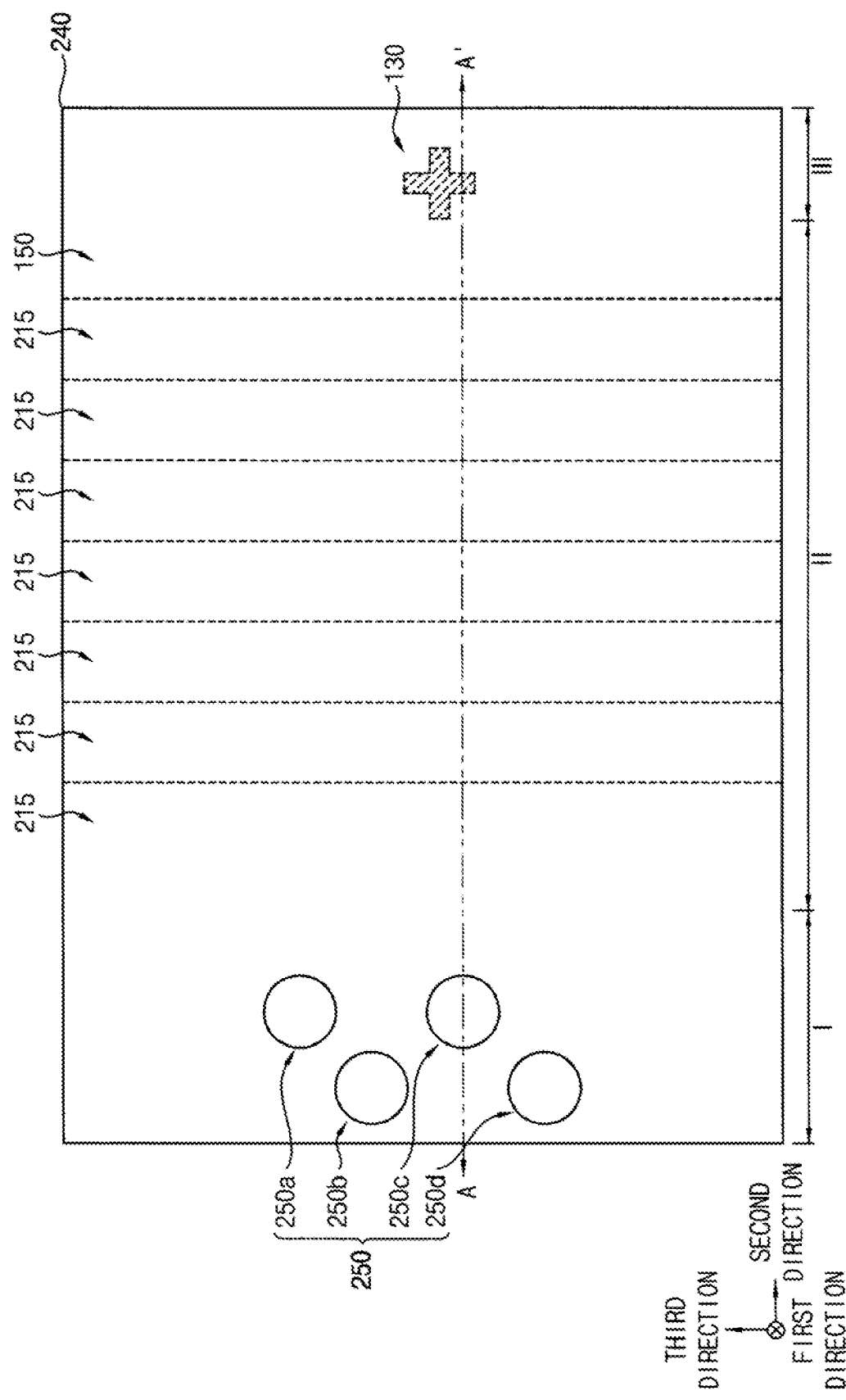
Figure 7:
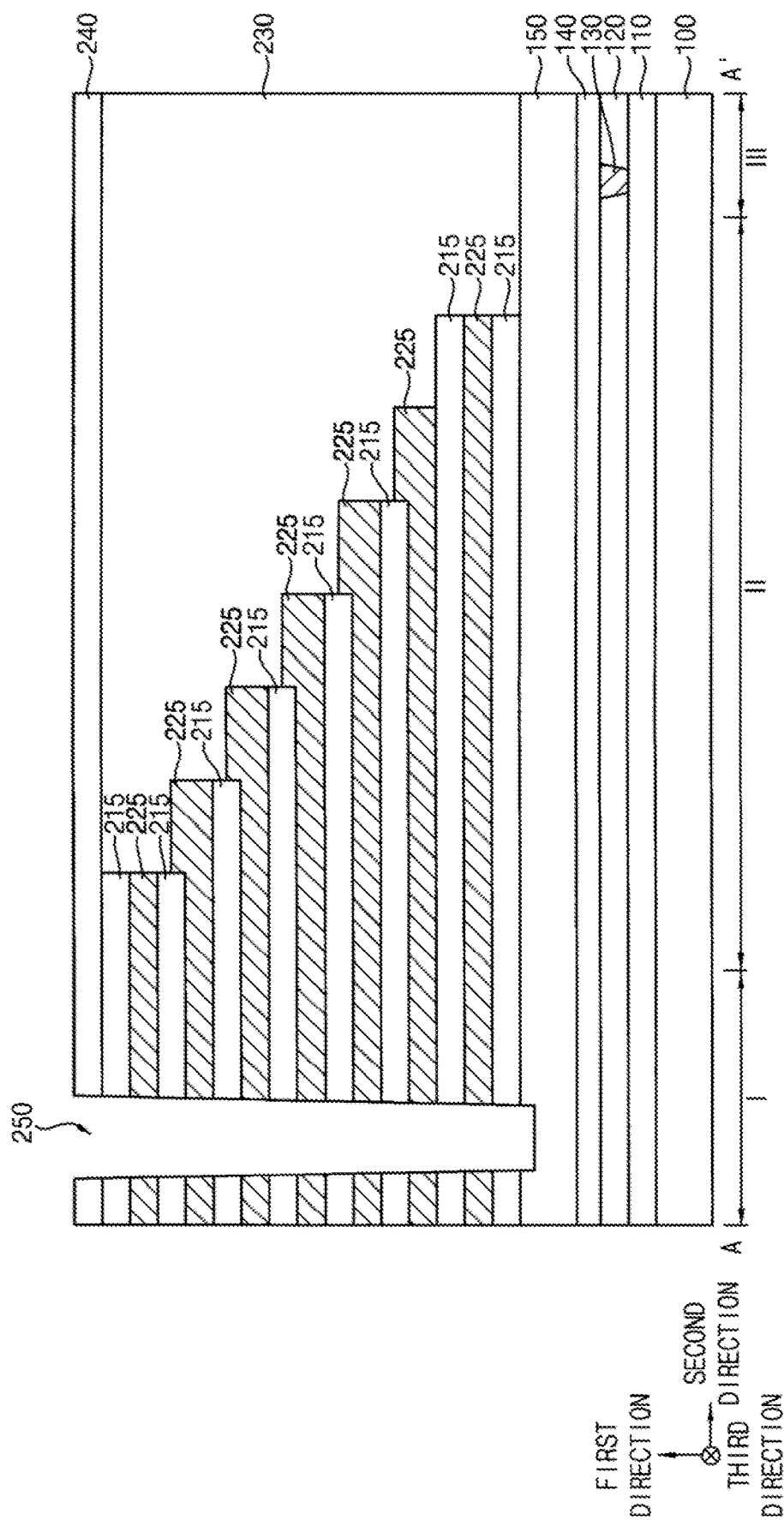

Referring to FIGS. 6 and 7, a first insulating interlayer may be formed on the semiconductor layer 150 to cover the mold, and may be planarized until an upper surface of the uppermost one of the first insulation patterns 215 is exposed to form a first insulating interlayer pattern 230 covering a sidewall of the mold. For example, a top surface of the first insulating interlayer pattern 230 may be coplanar with a top surface of the mold.

A second insulating interlayer 240 may be formed on an upper surface of the mold and an upper surface of the first insulating interlayer pattern 230. The first insulating interlayer pattern 230 and the second insulating interlayer 240 may include, for example, silicon oxide ($SiO_2$), and thus may be merged with each other and/or may be merged with the first insulation pattern 215.

After forming a first mask on the second insulating interlayer 240, the second insulating interlayer 240, the first insulation patterns 215 and the first sacrificial patterns 225 thereunder may be etched using the first mask as an etching mask to form a channel hole 250 through the second insulating interlayer 240, the first insulation patterns 215 and the first sacrificial patterns 225, in which the channel hole 250 may expose an upper surface of the semiconductor layer 150. The channel hole 250 may be formed by anisotropically etching the second insulating interlayer 240 and the mold. A top surface of the semiconductor layer 150 under the channel hole 250 may be recessed by over-etching. In other words, bottom surface of the channel hole 250 may be lower than the top surface of the semiconductor layer 150.

In an example embodiment of the present inventive concept, a width of the channel hole 250 may gradually decrease from a top toward a bottom thereof, due to the characteristics of the etching process.

A plurality of channel holes 250 may be formed in each of the second and third direction to define a channel hole array. In an example embodiment of the present inventive concept, the channel hole array may include a plurality of channel hole blocks spaced apart from each other in the third direction, and the channel hole block may include first to fourth channel hole columns 250a, 250b, 250c and 250d sequentially arranged in a zigzag form in the third direction in this order.

Figure 8:
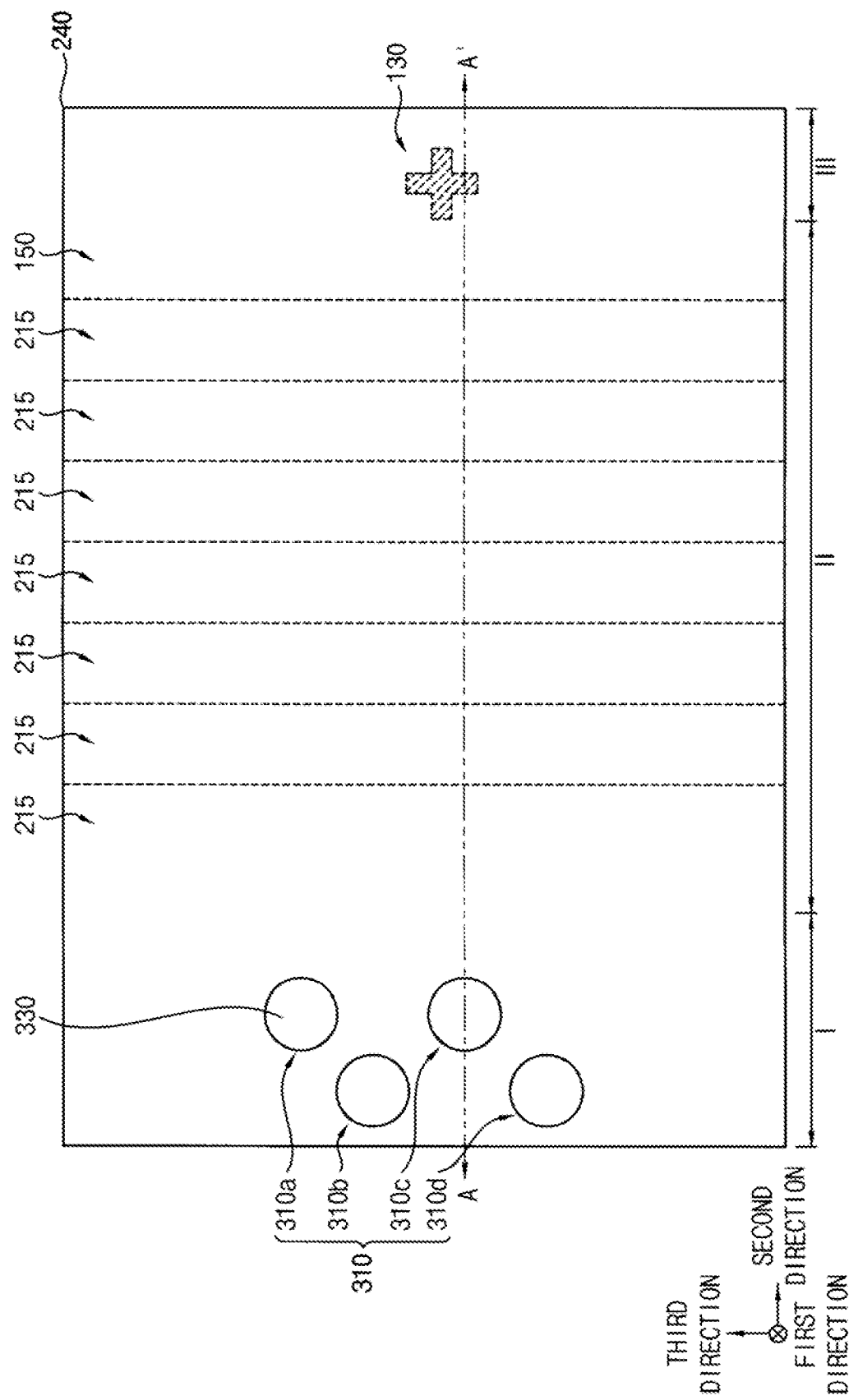
Figure 9:
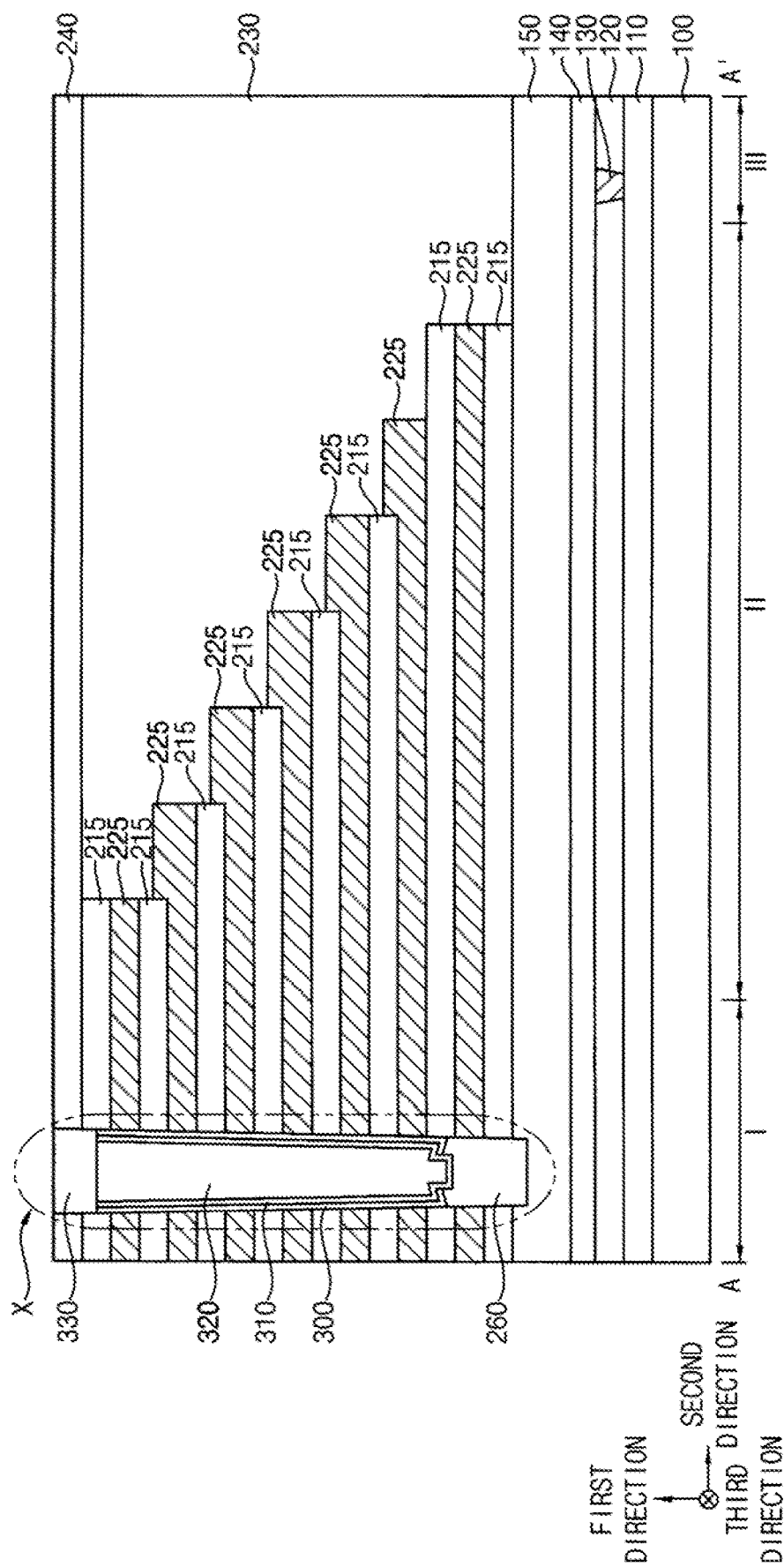
Figure 10:
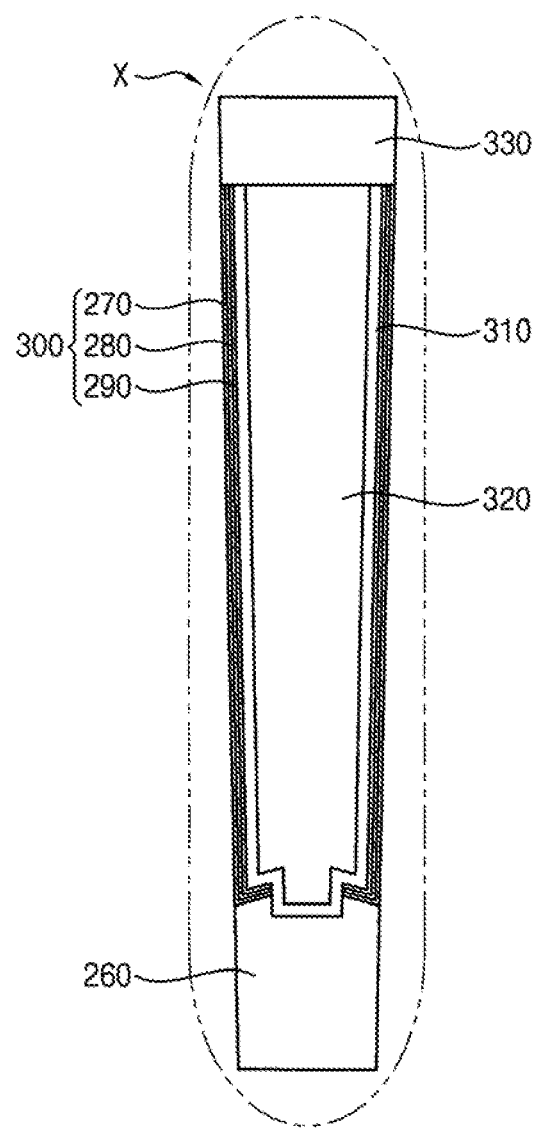

Referring to FIGS. 8 to 10, after removing the first mask, a first channel 260 partially filling the channel hole 250 may be formed. For example, the first channel 260 may fill a lower portion of the channel hole 250.

A selective epitaxial growth (SEG) process using the upper surface of the semiconductor layer 150 exposed by the channel hole 250 as a seed may be performed to form the first channel 260 partially filling the channel hole 250. Accordingly, the first channel 260 may include single crystalline silicon (Si) or single crystalline germanium (Ge) depending on a material of the semiconductor layer 150, and may be doped with impurities in some cases. When the semiconductor layer 150 is doped, the first channel 260 may also be doped and may include a semiconductor material having a conductivity type the same as that of the semiconductor layer 150.

A first blocking layer, a charge storage layer, a tunnel insulation layer and a first spacer layer may be sequentially formed on each of sidewalls of the channel holes 250, an upper surface of the first channel 260 and an upper surface of the second insulating interlayer 240. The first blocking layer, the charge storage layer, the tunnel insulation layer and the first spacer layer may be conformally formed to have thicknesses that do not completely fill each of the channel holes 250, and may be formed by, for example, an atomic layer deposition (ALD) process and/or a chemical vapor deposition (CVD) process. Then, the first spacer layer may be anisotropically etched to form a first spacer only remaining on each of the sidewalls of the channel holes 250, and the tunnel insulation layer, the charge storage layer and the first blocking layer may be etched using the first spacer as an etching mask. As a result, a tunnel insulation pattern 290, a charge storage pattern 280 and a first blocking pattern 270 may be formed to have a cup-like shape, of which a central lower surface is opened, on the first channel 260 and each of the sidewalls of the channel holes 250. During the etching process, an upper portion of the first channel 260 may be also partially removed. The etching process may be a vertical dry etching process such as, for example, reactive ion etching (RIE) process. The tunnel insulation pattern 290, the charge storage pattern 280 and the first blocking pattern 270 may form a charge storage structure 300.

The first blocking pattern 270 and the tunnel insulation pattern 290 may include an oxide, e.g., silicon oxide ($SiO_2$), and the charge storage pattern 280 and the first spacer may include a nitride, e.g., silicon nitride ($Si_3N_4$).

After removing the first spacer, a second channel layer may be formed on the exposed first channel 260, the tunnel insulation pattern 290 and the second insulating interlayer 240, and then a filling layer may be formed on the second channel layer to sufficiently fill remaining portion of each of the channel holes 250. The second channel layer may be formed by, for example, an atomic layer deposition (ALD) process and/or a chemical vapor deposition (CVD) process. The filling layer may be formed by a spin-on-glass (SOG) technique.

The filling layer and the second channel layer may be planarized until an upper surface of the second insulating interlayer 240 is exposed to form a filling pattern 320 filling the remaining portion of each of the channel holes 250, and the second channel layer may be transformed into a second channel 310. Accordingly, the charge storage structure 300, the second channel 310 and the filling pattern 320 may be sequentially stacked on the first channel 260 in each of the channel holes 250.

The second channel 310 may include, for example, doped or undoped single crystalline silicon (Si), and the filling pattern 320 may include an oxide, e.g., silicon oxide ($SiO_2$).

The channel holes 250 in which the first and second channels 260 and 310 are formed may define the channel hole block including the first to fourth channel hole columns 250a, 250b, 250c and 250d, and also define the channel hole array, and thus the first and second channels 260 and 310 may also define a channel block and a channel array corresponding thereto.

An upper portion of a first structure including the filling pattern 320, the second channel 310 and the charge storage structure 300 may be removed to form a trench, and a capping pattern 330 may be formed to fill the trench.

For forming the capping pattern 330, the upper portion of the first structure may be removed to form the trench by an etch back process, a capping layer filling the trench may be formed on the first structure and the second insulating interlayer 240, then an upper portion of the capping layer may be planarized until the upper surface of the second insulating interlayer 240 is exposed, and thus the capping pattern 330 may be formed. The capping pattern 330 may include, for example, doped or undoped polysilicon or single crystalline silicon (Si). The first structure, the first channel 260 and the capping pattern 330 in each of the channel holes 250 may define a second structure.

In an example embodiment of the present inventive concept, a width of the second structure in the channel hole 250 including the first and second channels 260 and 310 may gradually decrease from a top toward a bottom thereof depending on the shape of the channel hole 250.

Figure 11:
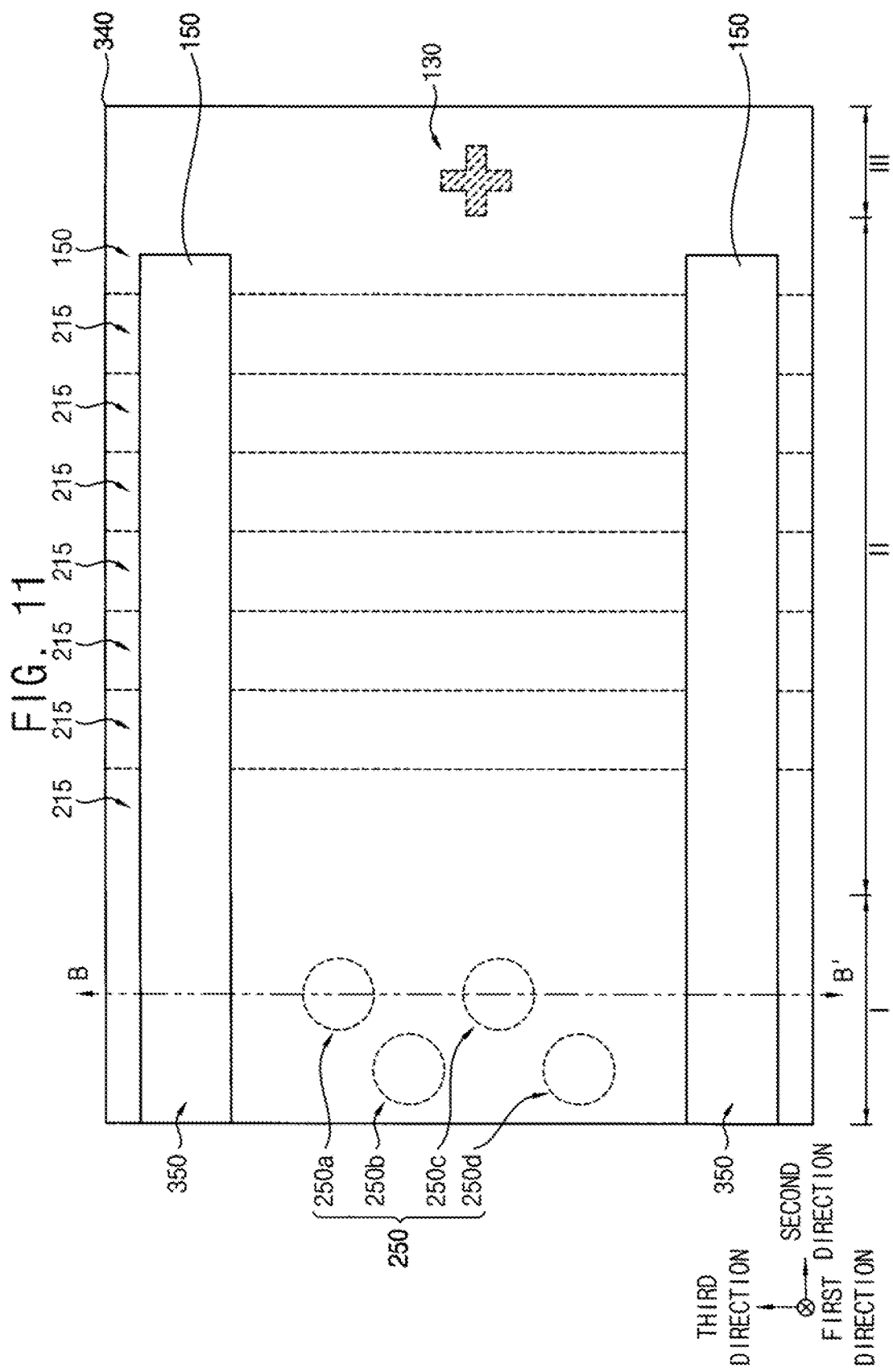
Figure 12:
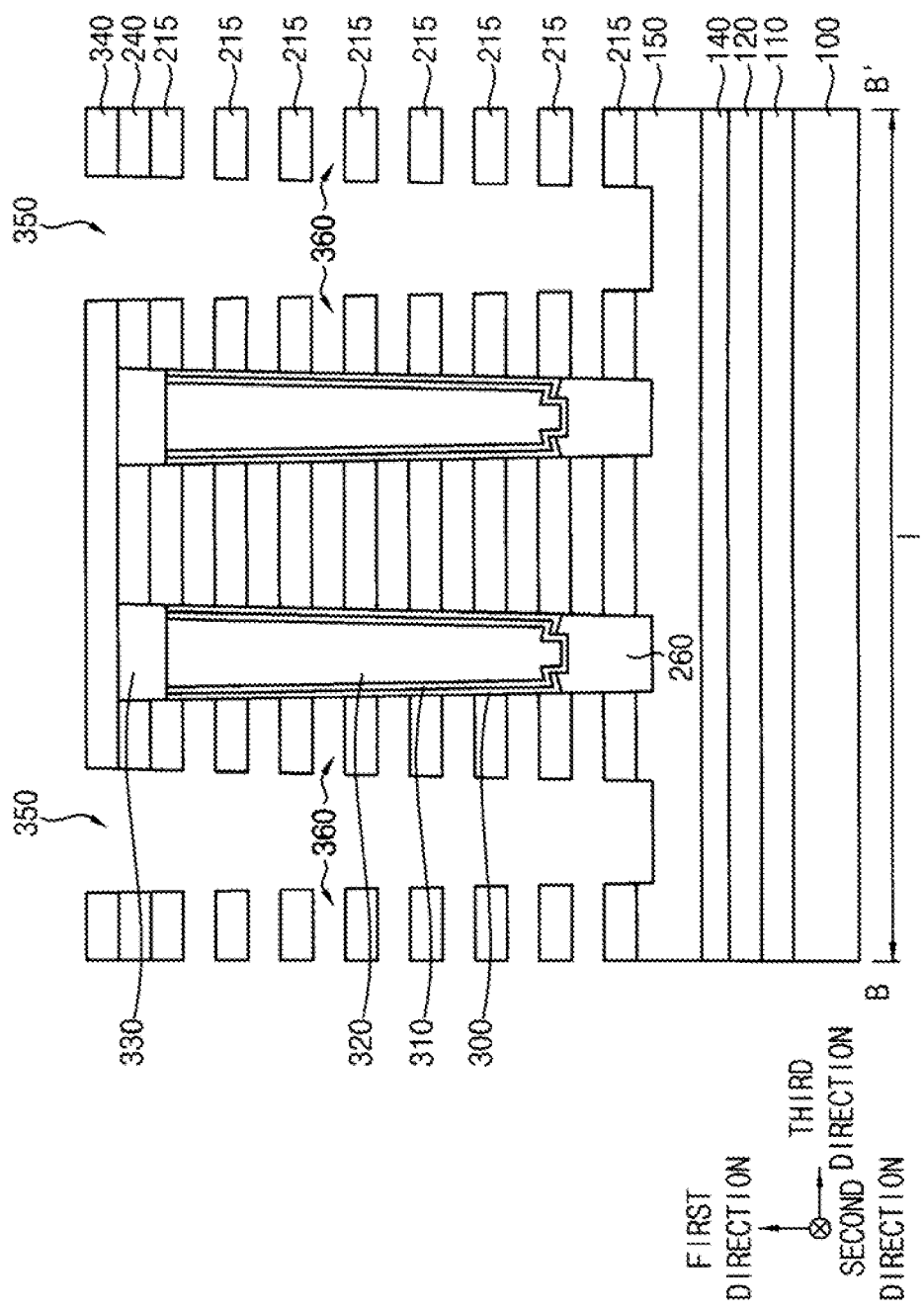

Referring to FIGS. 11 and 12, a third insulating interlayer 340 may be formed on the second insulating interlayer 240 and the capping pattern 330.

After forming a second mask on the third insulating interlayer 340, a first opening 350 may be formed through the third insulating interlayer 340, the second insulating interlayer 240, the first insulation patterns 215 and the first sacrificial patterns 225 using the second mask as an etching mask to expose the upper surface of the semiconductor layer 150. A width of the first opening 350 in the third direction may gradually decrease from a top toward a bottom thereof, due to the characteristics of the etching process. The third insulating interlayer 340 may include an oxide, e.g., silicon oxide ($SiO_2$), and thus may be merged with the second insulating interlayer 240 thereunder.

In an example embodiment of the present inventive concept, the first opening 350 may be formed to extend in the second direction between the channel blocks in the first and second regions I and II, and thus a plurality of first openings 350 may be formed and spaced apart from each other in the third direction. That is, one channel block including four channel columns therein may be formed between two first openings 350 adjacent to each other. However, the present inventive concept may not be limited thereto.

After removing the second mask, the first sacrificial patterns 225 exposed by the first opening 350 may be removed to form a gap 360 between neighboring ones of the first insulation patterns 215 in the first direction, and a portion of an outer sidewall of the first blocking pattern 270 and a portion of a sidewall of the first channel 260 may be exposed by the gap 360. In an example embodiment of the present inventive concept, the first sacrificial patterns 225 exposed by the first opening 350 may be removed by a wet etching process using an etchant including phosphoric acid ($H_3PO_4$) or sulfuric acid ($H_2SO_4$). For example, when the first sacrificial patterns 225 are formed of silicon nitride ($Si_3N_4$) and the first insulation patterns 215 are formed of silicon oxide ($SiO_2$), the first sacrificial patterns 225 may be removed by an etching process using an etching solution including phosphoric acid ($H_3PO_4$).

Figure 13:
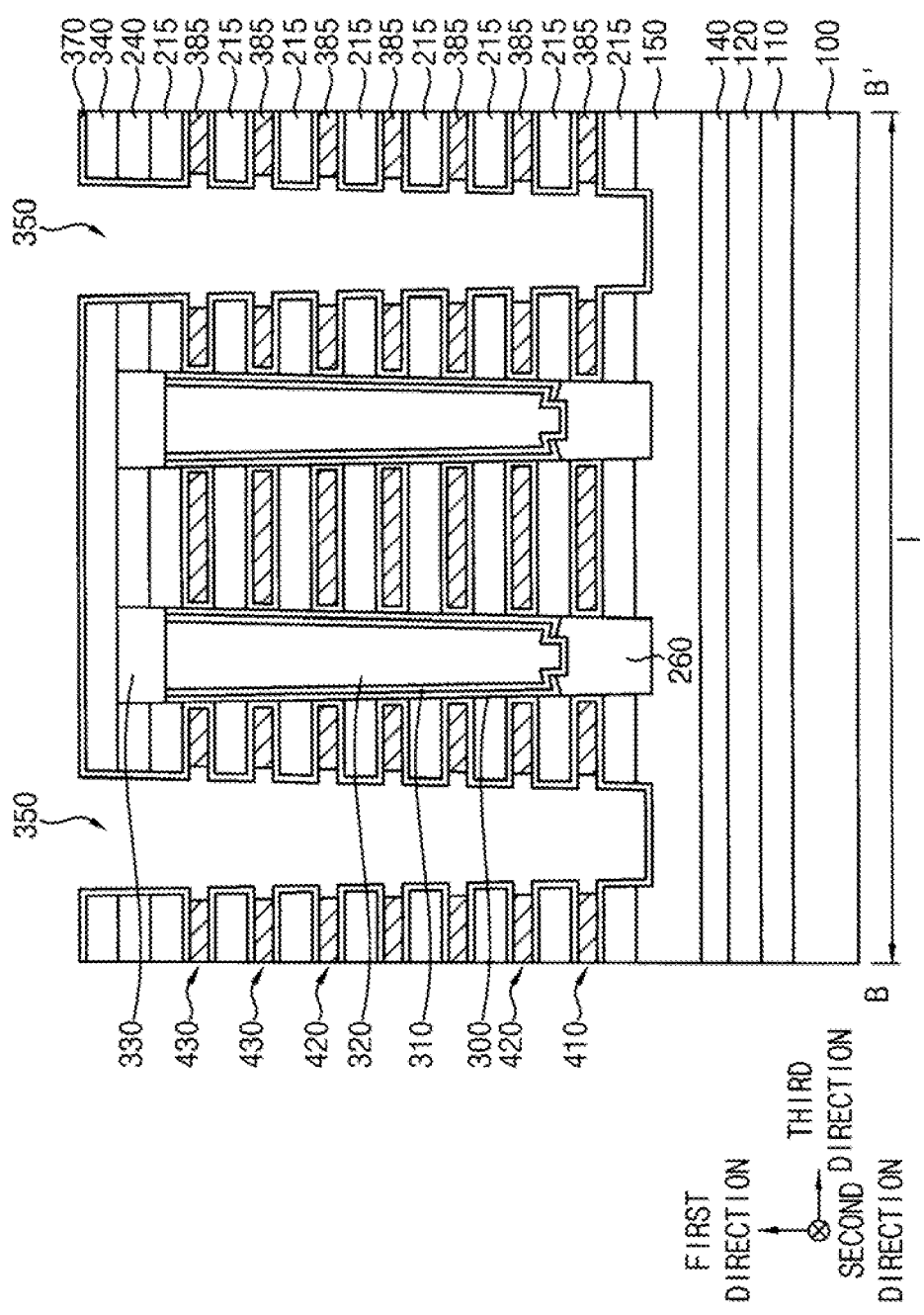

Referring to FIG. 13, after forming a second blocking layer 370 on a sidewall of the first opening 350, the exposed outer sidewall of the first blocking pattern 270, the exposed upper surface of the semiconductor layer 150 and an upper surface of the third insulating interlayer 340, a first conductive layer may be formed on the second blocking layer 370 to fill a remaining portion of the gap 360. The second blocking layer 370 may be formed by a deposition method having an excellent step coverage property. For example, the second blocking layer 370 may be formed by a chemical vapor deposition (CVD) process or an atomic layer deposition (ALD)) process. A barrier layer may be further formed between the second blocking layer 370 and the first conductive layer.

The second blocking layer 370 may include a metal oxide, e.g., aluminum oxide ($Al_2O_3$), hafnium oxide ($HfO_2$), etc., the first conductive layer may include a low resistance metal, e.g., tungsten (W), titanium (Ti), tantalum (Ta), platinum (Pt), etc., and the barrier layer may include a metal nitride, e.g., titanium nitride (TiN), tantalum nitride (TaN), etc.

The first conductive layer in the first opening 350 and the gap 360 adjacent thereto may be removed to form a first conductive pattern 385 in the gap 360. As described above, when the barrier layer is further formed, a barrier pattern covering upper and lower surfaces and a sidewall of the first conductive pattern 385 may be further formed. In an example embodiment of the present inventive concept, the first conductive layer may be partially removed by a wet etching process.

In an example embodiment of the present inventive concept, the first conductive patterns 385 may extend in the second direction in the first and second regions I and II, and a plurality of first conductive patterns 385 may be formed in the third direction. That is, the first conductive patterns 385 each extending in the second direction may be spaced apart from each other in the third direction by the first opening 350.

Hereinafter, an end portion of the first conductive pattern 385 in the second direction may be referred to as a pad. In an example embodiment of the present inventive concept, the end portion of at least one of the first conductive patterns 385 may have an upper surface higher than those of other portions thereof, and thus may have a thickness greater than those of other portions thereof. The end portions of the first conductive patterns 385 may be formed in the second region II.

In an example embodiment of the present inventive concept, the first conductive patterns 385 may include first to third gate electrodes 410, 420 and 430 sequentially stacked in the first direction. The first gate electrode 410 may serve as a ground selection line (GSL), the second gate electrode 420 may serve as a word line, and the third gate electrode 430 may serve as a string selection line (SSL). Each of the first to third gate electrodes 410, 420 and 430 may be formed at one level or a plurality of levels.

In an example embodiment of the present inventive concept, the first gate electrode 410 may be formed at a lowermost level, the third gate electrodes 430 may be formed at an uppermost level and a level directly under the uppermost level, and the second gate electrodes 420 may be formed at a plurality of levels between the first gate electrode 410 and the third gate electrodes 430. However, the present inventive concept may not be limited thereto.

Figure 14:
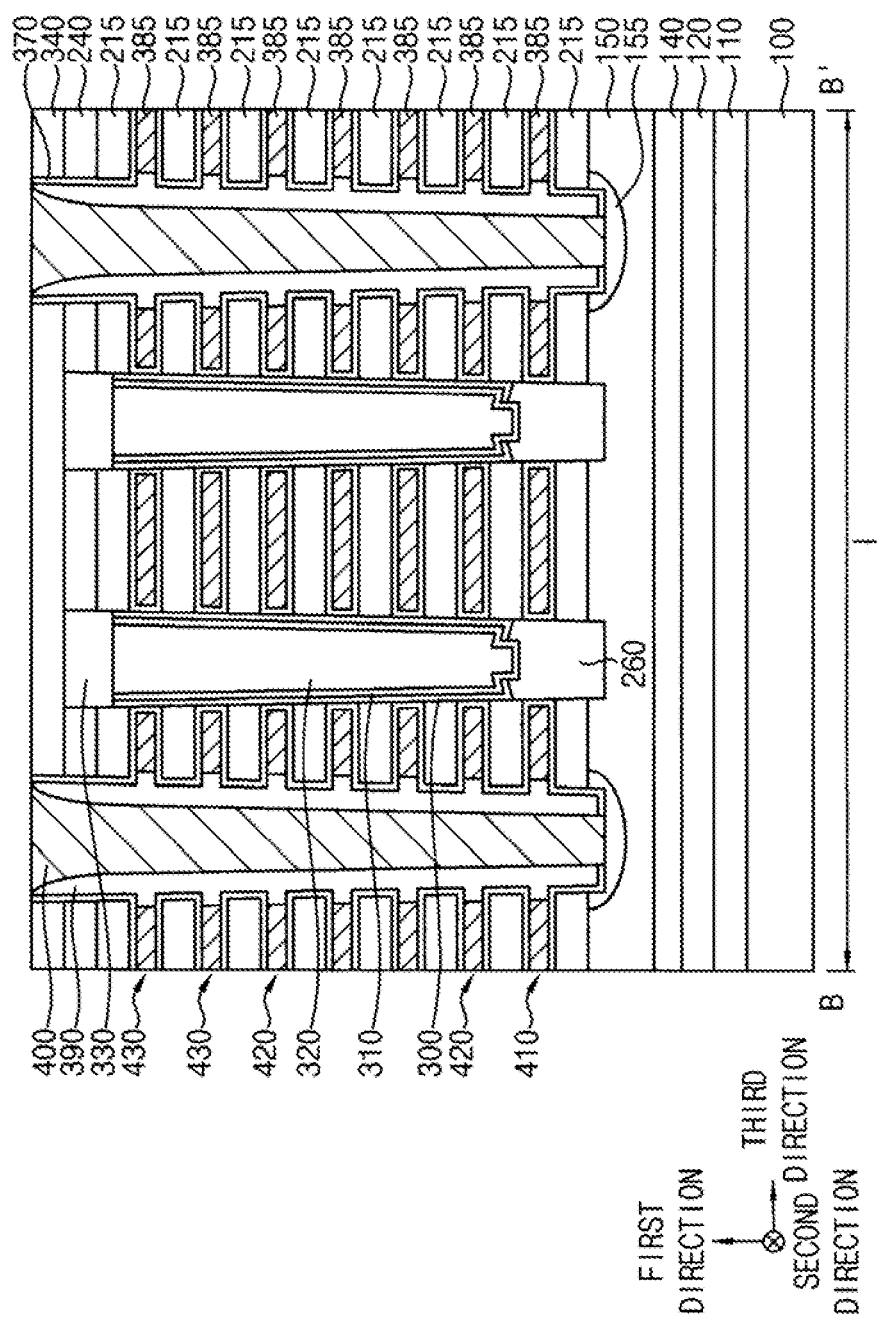

Referring to FIG. 14, after forming a first impurity region 155 at an upper portion of the semiconductor layer 150 exposed by the first opening 350, a second spacer 390 may be formed on each of opposite sidewalls of the first opening 350 in the third direction, and a first common source line (CSL) 400 filling a remaining central portion of the first opening 350 may be formed. The first impurity region 155 may be formed at the upper portion of the semiconductor layer 150 exposed by the first opening 350 by an ion implantation process.

In an example embodiment of the present inventive concept, a thickness of the second spacer 390 in the third direction may gradually increase from a top toward a bottom thereof, and thus a width of the first CSL 400 in the third direction may gradually decrease from a top toward a bottom thereof.

The first impurity region 155 may include an n-type impurity, e.g., phosphorus (P), arsenic (As), etc., the second spacer 390 may include an oxide, e.g., silicon oxide ($SiO_2$), and the first CSL 400 may include a low resistance metal, e.g., tungsten (W), titanium (Ti), tantalum (Ta), platinum (Pt), etc.

In an example embodiment of the present inventive concept, the first CSL 400 may extend in the second direction to separate neighboring ones of the first conductive patterns 385 in the third direction at the same level from each other in the first and second regions I and II, however, the first CSL 400 may be electrically insulated from the first conductive patterns 385 because a sidewall of the first CSL 400 may be covered by the second spacer 390. The first CSL 400 may contact an upper surface of the first impurity region 155 at the upper portion of the semiconductor layer 150, and thus may be electrically connected to the first impurity region 155.

As the first to third gate electrodes 410, 420 and 430, the first channel 260 and the second channel 310, and the first CSL 400 may be formed in the first region I, a memory cell array of the vertical memory device may be formed.

Figure 15:
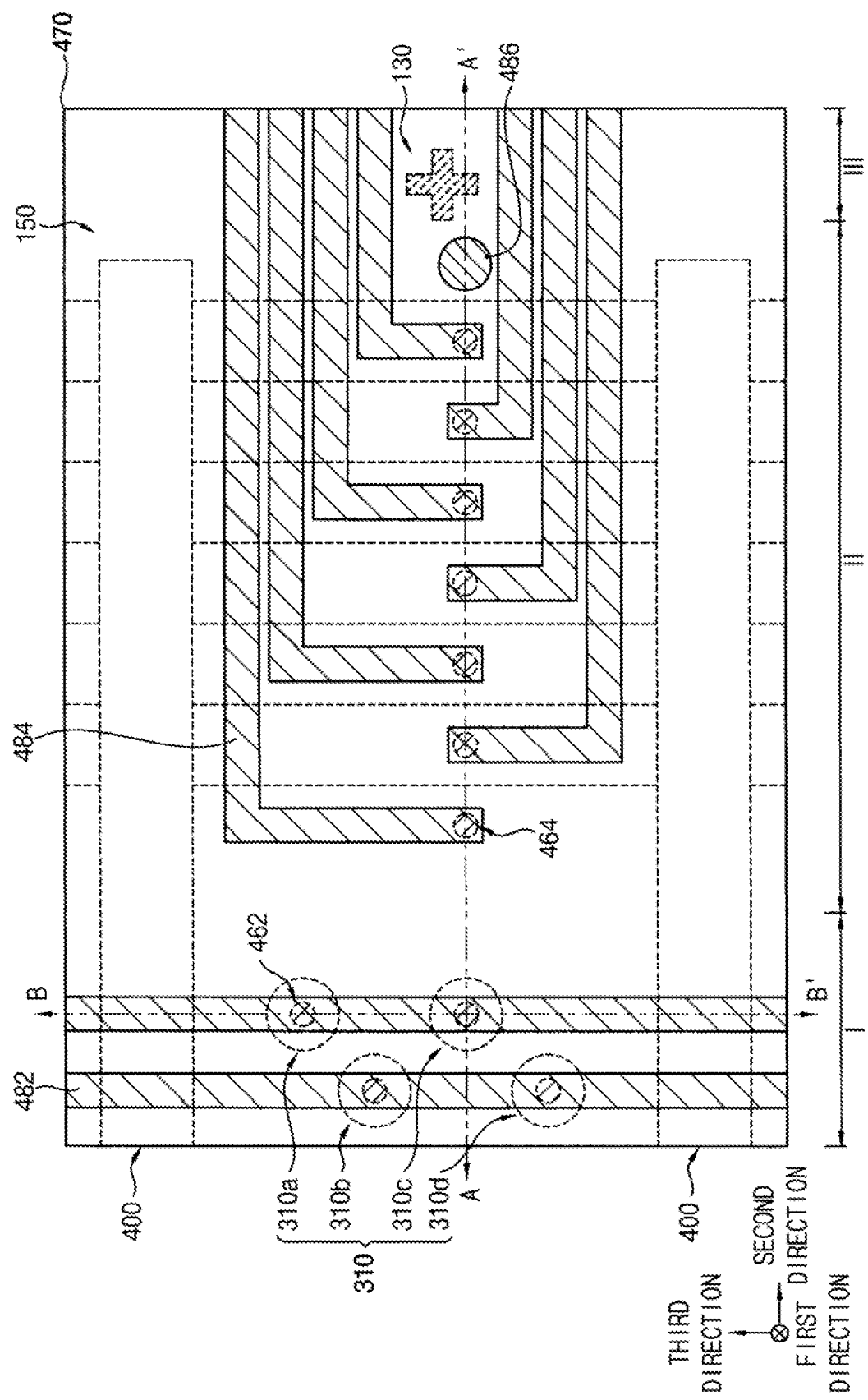
Figure 16:
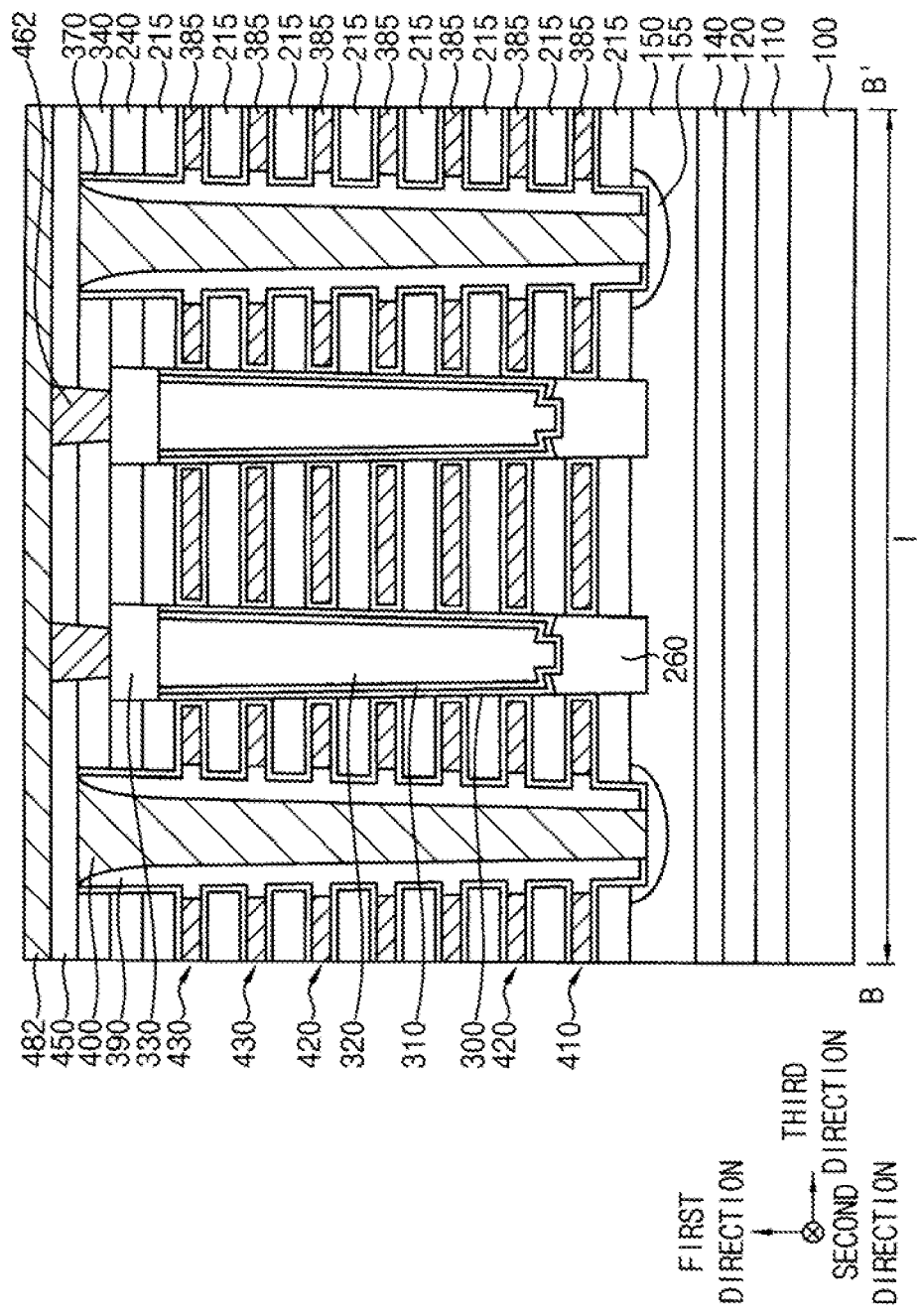
Figure 17:
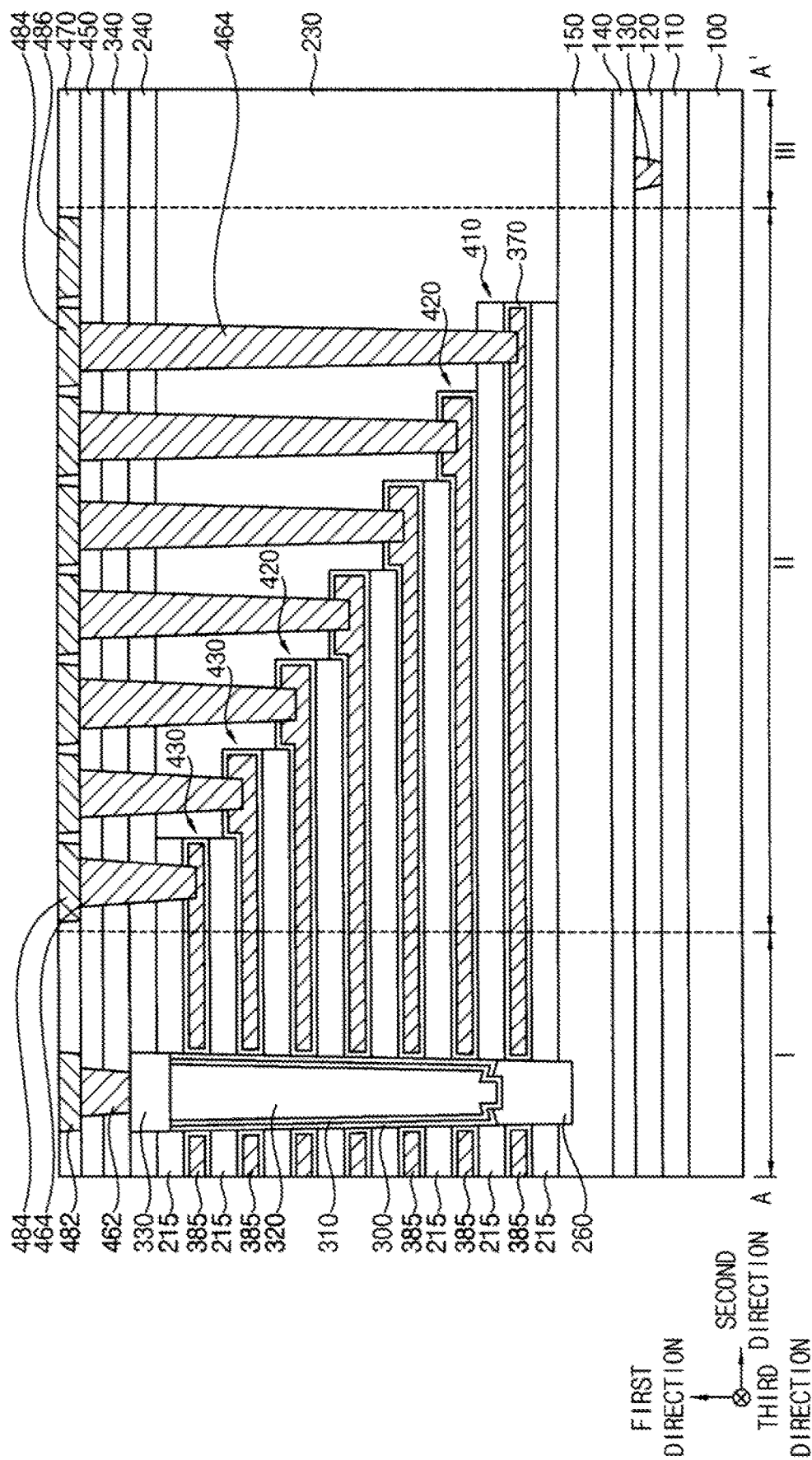

Referring to FIGS. 15 to 17, after forming a fourth insulating interlayer 450 on the third insulating interlayer 340 and the first CSL 400, a first contact plug 462 extending in the first direction through the third and fourth insulating interlayers 340 and 450 to contact an upper surface of the capping pattern 330 in the first region I, and a second contact plug 464 extending through the first insulating interlayer pattern 230 and the second to fourth insulating interlayers 240, 340 and 450 to contact an upper portion of the pad of the first conductive pattern 385 may be formed in the second region II. Upper surfaces of the second contact plugs 464 may be substantially coplanar with each other, and the upper surface of each of the second contact plugs 464 may be substantially coplanar with an upper surface of the first contact plug 462 which extends in the first direction above the first and second channels 260 and 310.

At least one of the pads of the first to third gate electrodes 410, 420 and 430 including the first conductive pattern 385 may have a thickness greater than those of other portions thereof, so that each of the second contact plugs 464 may be easily formed to contact the upper portion of the pad of the first conductive pattern 385.

A fifth insulating interlayer 470 may be formed on the fourth insulating interlayer 450, and the first and second contact plugs 462 and 464, and first and second wirings 482 and 484 may be formed through the fifth insulating interlayer 470 to contact upper surfaces of the first and second contact plugs 462 and 464, respectively, in the first and second regions I and II, respectively. A third wiring 486 may be formed through the fifth insulating interlayer 470 in the second region II.

In an example embodiment of the present inventive concept, a width of each of the first and second contact plugs 462 and 464 may gradually decrease from a top toward a bottom thereof, due to the characteristics of the etching process. In an example embodiment of the present inventive concept, the first and second contact plugs 462 and 464 and the first and second wirings 482 and 484 may be formed after forming the memory cell array in which a high temperature process may be needed, and thus the first and second contact plugs 462 and 464 and the first and second wirings 482 and 484 may also include a relatively low thermal resistance material. Accordingly, the first and second contact plugs 462 and 464 and the first and second wirings 482 and 484 may include a metal, e.g., tungsten (W), copper (Cu), aluminum (Al), etc., and may further include a barrier pattern including a metal nitride and covering a lower surface and a sidewall thereof. Since the high temperature process for forming the cell array is carried out before the formation of the wirings and the contact plugs, the characteristics of the first and second contact plugs 462 and 464 and the first and second wirings 482 and 484 may not be deteriorated. Thus, the vertical memory device fabricated according to the above described method may have enhanced electrical characteristics.

A third contact plug extending through the fourth insulating interlayer 450 to contact an upper surface of the first CSL 400, and a fourth wiring extending through the fifth insulating interlayer 470 to contact an upper surface of the third contact plug may be further formed.

In an example embodiment of the present inventive concept, the first wiring 482 may extend in the third direction to cross the first to third gate electrodes 410, 420 and 430, and a plurality of first wirings 482 may be formed and spaced apart from each other in the second direction in the first region I. The first wiring 482 may serve as a bit line of the vertical memory device.

A layout of the first to third wirings 482, 484 and 486 illustrated in FIG. 15 is illustrative, and the present inventive concept may not be limited thereto. In addition, additional upper wirings may be further formed at upper levels higher than those of the first to third wirings 482, 484 and 486.

Figure 18:
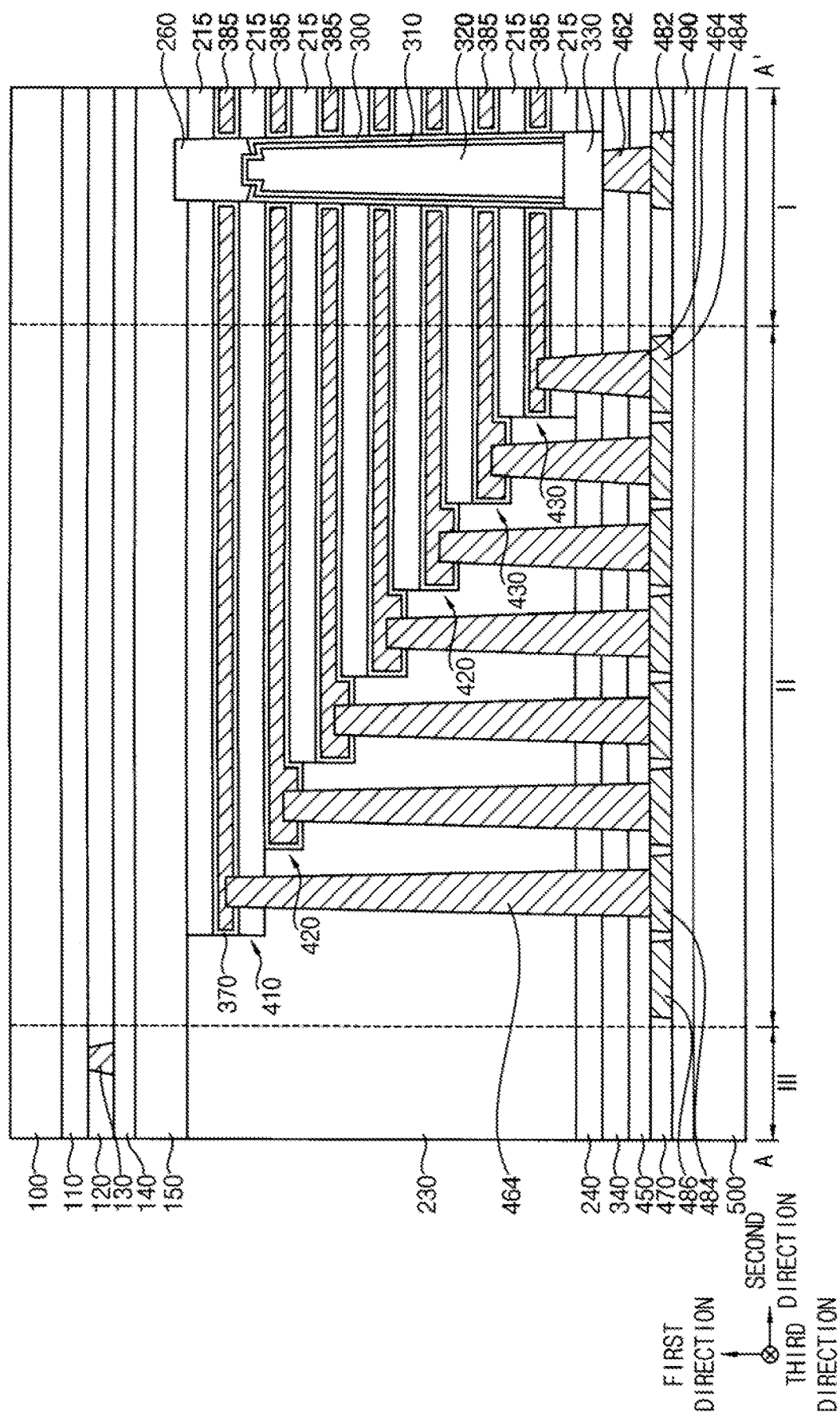

Referring to FIG. 18, a sixth insulating interlayer 490 may be formed on the fifth insulating interlayer 470 and the first to third wirings 482, 484 and 486, a handling substrate 500 may be formed on the sixth insulating interlayer 490, and the substrate on which the structures are formed may be inverted using the handling substrate 500. Accordingly, hereinafter, upper and lower portions of the structures are referred to according as the directions shown in the drawing. That is, for example, each of the second contact plugs 464 may have a width gradually increasing from the top toward the bottom thereof in the first direction. For example, lower surfaces of the second contact plugs 464 may be substantially coplanar with each other, and the lower surface of each of the second contact plugs 464 may be substantially coplanar with a lower surface of the first contact plug 462 which extends in the first direction under the first and second channels 260 and 310.

In an example embodiment of the present inventive concept, the handling substrate 500 may include silicon carbide (SiC) or sapphire, and thus the bending of the substrate may be prevented. In an example embodiment of the present inventive concept, the handling substrate 500 may include silicon (Si), and the bending of the substrate may be reduced as a thickness of the handling substrate 500 increases.

An insulating adhesive layer may be further formed between the handling substrate 500 and the sixth insulating interlayer 490.

Figure 19:
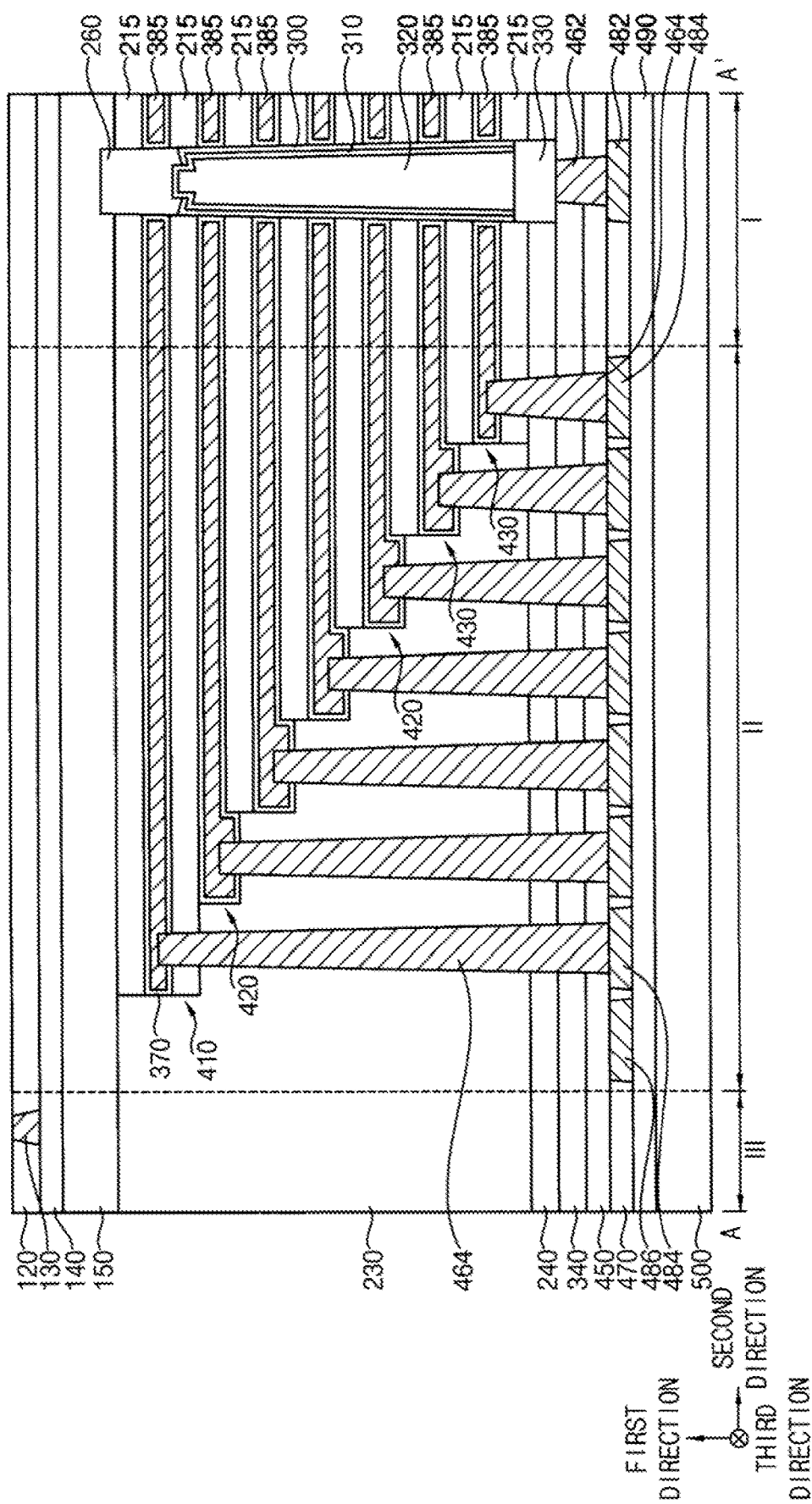

Referring to FIG. 19, the first single crystalline silicon layer 100 of the SOI substrate may be removed by a laser lift-off process or a lapping process, and thus the buried oxide layer 110 may be exposed.

The exposed buried oxide layer 110 may be removed, for example, by a wet etching process, and thus the second single crystalline silicon layer 120 may be exposed. Any suitable wet etching process may be used to remove the oxide. For example, the exposed buried oxide layer 110 may be removed to reveal the second single crystalline silicon layer 120 by exposing the exposed buried oxide layer 110 to an oxide removal agent which includes hydrogen fluoride (HF) in an aqueous solution.

When the substrate is not an SOI substrate but a bulk substrate, an upper portion of the bulk substrate may be removed by the laser lift-off process or the lapping process, and a lower portion thereof may remain.

Figure 20:
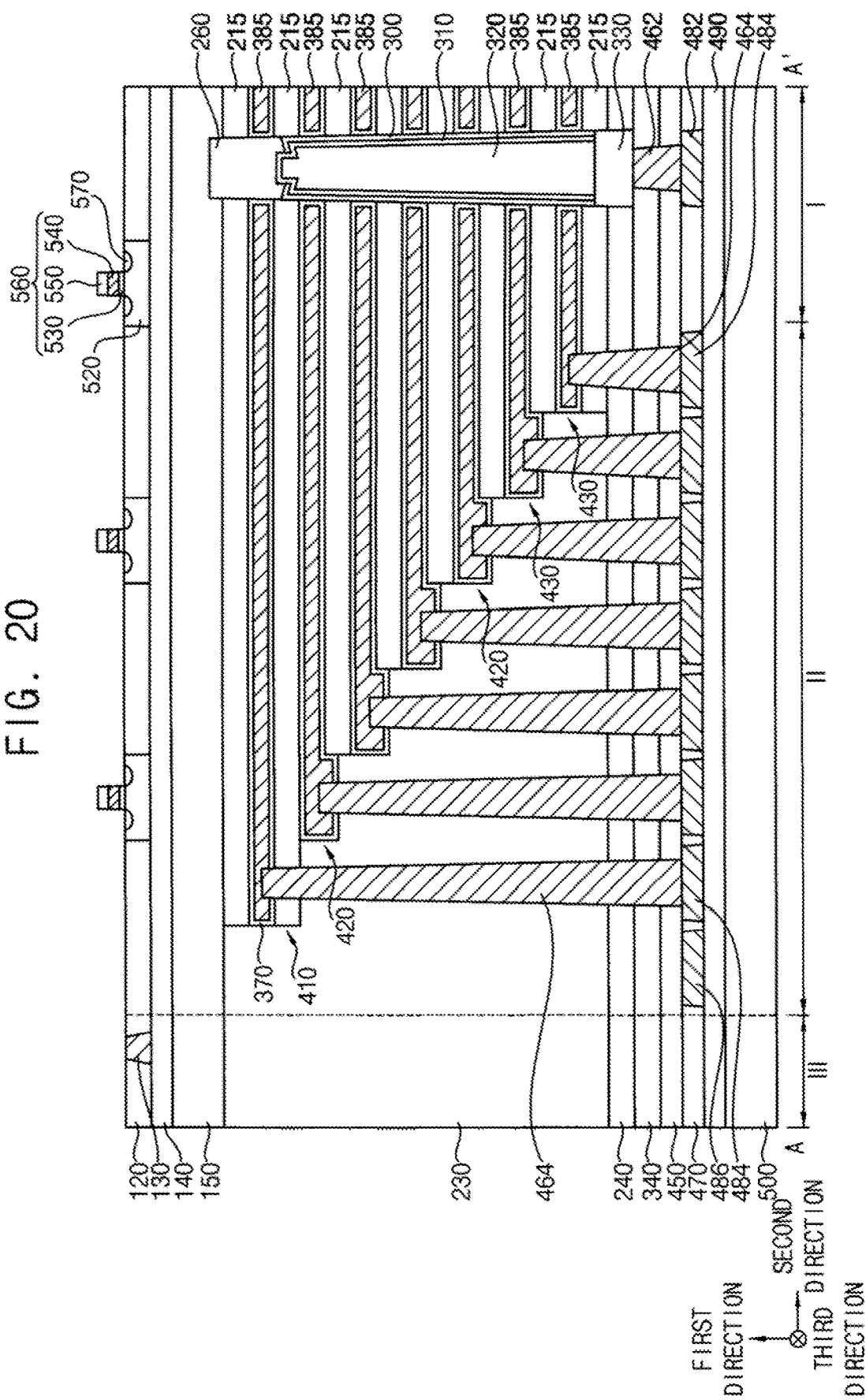

Referring to FIG. 20, impurities may be implanted into a portion of the second single crystalline silicon layer 120 to form a well 520, and a transistor may be formed on the well 520.

The well 520 may include n-type or p-type impurities depending on the conductivity type of the transistor to be formed. Alternatively, for example, a shallow trench isolation (STI) process may be performed to remove a portion of the second single crystalline silicon layer 120, an isolation pattern may be formed to define an active region, and the transistor may be formed on the active region.

A gate structure 560 may be formed on the well 520, and a second impurity region 570 may be formed at an upper portion of the well 520 adjacent to the gate structure 560 to form the transistor. The gate structure 560 may include a gate insulation pattern 530, a gate conductive pattern 540 and a gate mask 550 sequentially stacked on the well 520.

The gate insulation pattern 530 may include an oxide, e.g., silicon oxide ($SiO_2$), the gate conductive pattern 540 may include, e.g., a metal (e.g., tungsten (W), copper (Cu), aluminum (Al), titanium (Ti) or tantalum (Ta)), a metal nitride (e.g., titanium nitride (TiN) or tantalum nitride (TaN)), a metal silicide (e.g., titanium silicide ($TiSi_2$), tungsten silicide ($WSi_2$), cobalt silicide ($CoSi_2$) or nickel silicide ($NiSi_2$)), a polysilicon (Si) doped with impurities, etc., the gate mask 550 may include a nitride, e.g., silicon nitride ($Si_3N_4$), and the second impurity region 570 may include n-type or p-type impurities.

In an example embodiment of the present inventive concept, the transistor may be formed at a precise position originally designed by referring to the align key 130 in the third region III.

The transistor may be formed on the second single crystalline silicon layer 120, and thus the transistor may have enhanced characteristics rather than, for example, a transistor formed on a polysilicon layer. Also, the second single crystalline silicon layer 120 may have a thin thickness, for example, 2 μm or less, so that a short channel effect of the transistor may be reduced.

Figure 21:
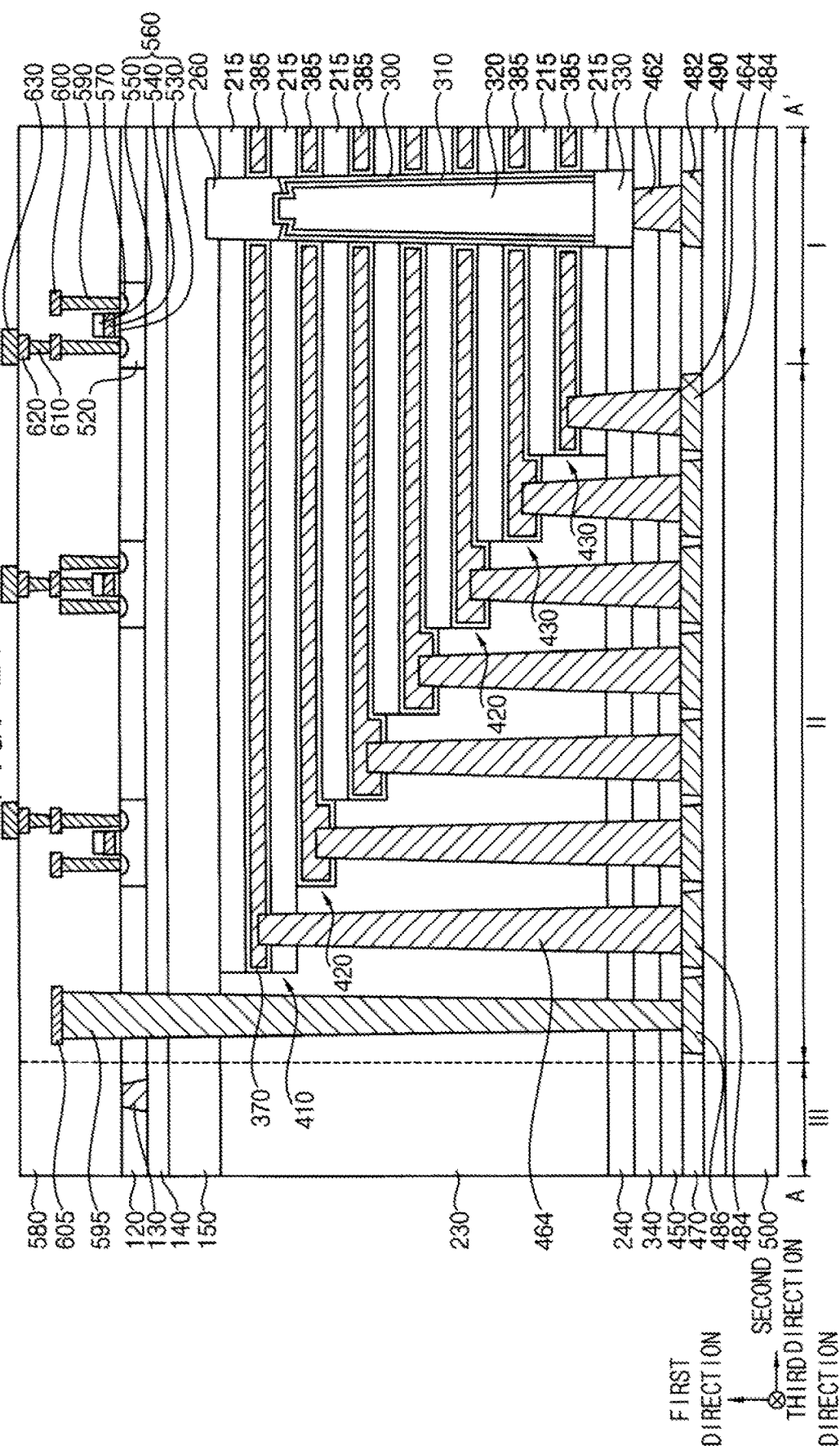
Figure 22:
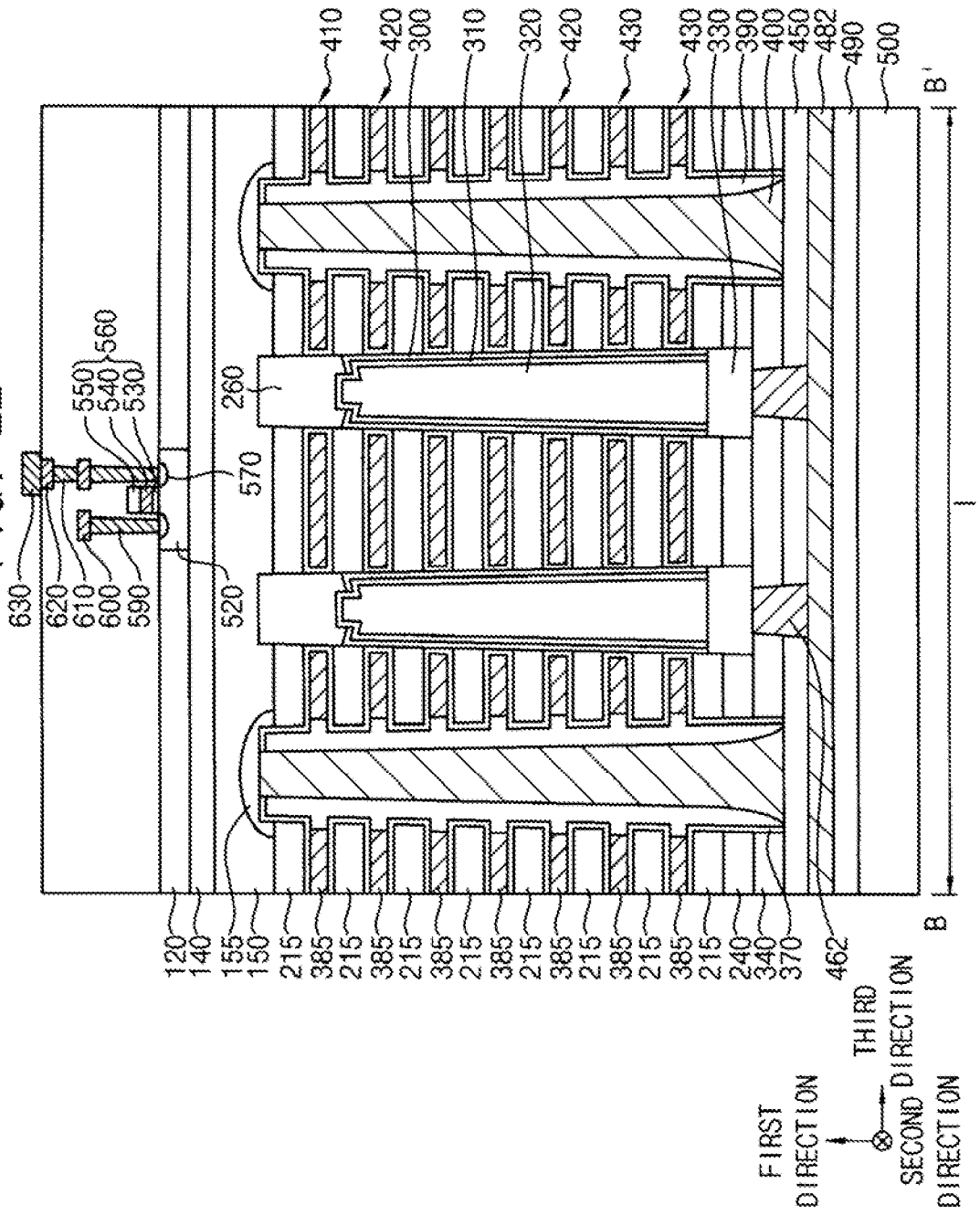

Referring to FIGS. 21 and 22, after forming a seventh insulating interlayer 580 on the second single crystalline silicon layer 120 to cover the transistor, fourth and fifth contact plugs 590 and 610 and fifth and sixth wirings 600 and 620 may be formed in the seventh insulating interlayer 580.

A sixth contact plug 595 may be formed through a lower portion of the seventh insulating interlayer 580, the second single crystalline silicon layer 120, the insulating buffer layer 140, the semiconductor layer 150, the first insulating interlayer pattern 230, and the second to fifth insulating interlayers 240, 340, 450 and 470 to contact the third wiring 486 in the fifth insulating interlayer 470. A seventh wiring 605, which is in the seventh insulating interlayer 580, may be further formed on the sixth contact plug 595. The sixth contact plug 595 may serve as a through hole via (THV) which may be formed for electrical connection between the memory cell array and the transistors, and the third wiring 486 may serve as a landing pad for the sixth contact plug 595.

A width of each of the fourth to sixth contact plugs 590, 610 and 595 may gradually decrease from a top toward a bottom thereof, due to the characteristics of the etching process. In an example embodiment of the present inventive concept, upper surfaces of the fourth and sixth contact plugs 590 and 595 may be substantially coplanar with each another, and upper surfaces of the fifth and seventh wirings 600 and 605 may be formed substantially coplanar with each other.

An eighth wiring 630 may be formed on the seventh insulating interlayer 580, and additional wirings may be further formed to complete the fabrication of the vertical memory device.

The third region III in which the handling substrate 500 and the align key 130 are formed may be removed later.

As described above, the vertical memory device in accordance with an example embodiment of the present inventive concept may have a peri-over-cell (POC) structure that may be opposite to a cell-over-peri (COP) structure. Thus, the contact plugs and the wirings may be formed after forming the memory cell array carrying a high temperature process, so that the material of the contact plugs and the wirings may not be limited, and the memory cell array may be prevented from being contaminated by metal components included in the contact plugs and the wirings. Accordingly, the vertical memory device fabricated according to the above described method may have enhanced electrical characteristics.

The memory cell array may be formed on an SOI substrate or a bulk substrate, and after inverting the SOI or bulk substrate, the transistor may be formed on the inverted SOI or bulk substrate, and thus the transistor may be formed on a single crystalline silicon layer. Accordingly, the transistor may have enhanced electrical characteristics rather than, for example, a transistor formed on a polysilicon layer. Also, the handling substrate 500 for inverting the substrate may have a thick thickness or may include silicon carbide (SiC) or sapphire, so that the bending of the substrate due to the stacking of memory cells at a large number of levels may be alleviated.

Since the align key 130 is formed at a portion of the substrate, e.g., a portion of the second single crystalline silicon layer 120, the transistor may be formed by inverting the substrate, and thus the transistor may be formed at a precise position originally designed by referring to the align key 130.

The vertical memory device manufactured by processes described above may have structural characteristics as below.

The first conductive patterns 385 may be sequentially stacked under the second single crystalline silicon layer 120 to be spaced apart from each other in the first direction substantially perpendicular to the substrate, that is, perpendicular to a lower surface of the second single crystalline silicon layer 120, and may be arranged to have a staircase shape of which extension lengths of steps in the second direction substantially parallel to the lower surface of the second single crystalline silicon layer 120 may gradually decrease from an uppermost one toward a lowermost one. A surface of at least one end portion in the second direction of the first conductive patterns 385, that is, a lower surface of at least one pad of the first conductive patterns 385, may be lower than lower surfaces of other portions thereof.

The first conductive patterns 385 may include the first to third gate electrodes 410, 420 and 430 sequentially stacked from an uppermost level toward a lowermost level, and the first to third gate electrodes 410, 420 and 430 may serve as a GSL, a word line and SSL, respectively. In an example embodiment of the present inventive concept, the first gate electrode 410 may be formed at the uppermost level, the third gate electrodes 430 may be formed at the lowermost level and one level directly above the lowermost level, and the second gate electrodes 420 may be formed at a plurality of levels between the first and third gate electrodes 410 and 430.

The first structure including the first and second channels 260 and 310 may extend in the first direction through the first to third gate electrodes 410, 420 and 430, and a width of the first structure may gradually increase from a top toward a bottom thereof.

The second contact plug 464 may extend in the first direction to contact the lower surface of the pad of each of the first to third gate electrodes 410, 420 and 430, and a width of the second contact plug 464 may gradually increase from a top toward a bottom thereof. Also, the first CSL 400 may extend in the second direction to separate the first to third gate electrodes 410, 420 and 430 in the third direction, and a width of the first CSL 400 may gradually increase from a top toward a bottom thereof. For example, the first CSL 400 may extend in the second direction to separate the first conductive patterns 385 in the third direction.

A width of each of the fourth to sixth contact plugs 590, 610 and 595 may gradually decrease from a top toward a bottom thereof.

Figure 23:
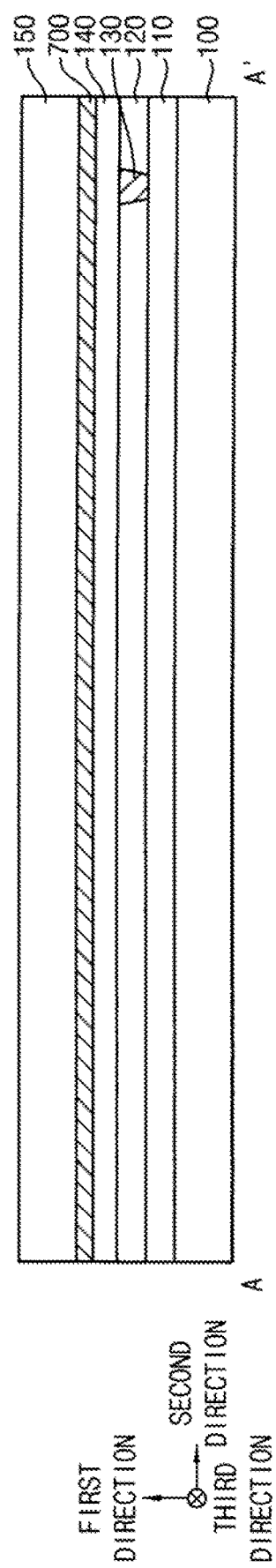
FIGS. 23 to 28 are cross-sectional views illustrating a method of manufacturing a vertical memory device in accordance with an example embodiment of the present inventive concept.
Figure 24:
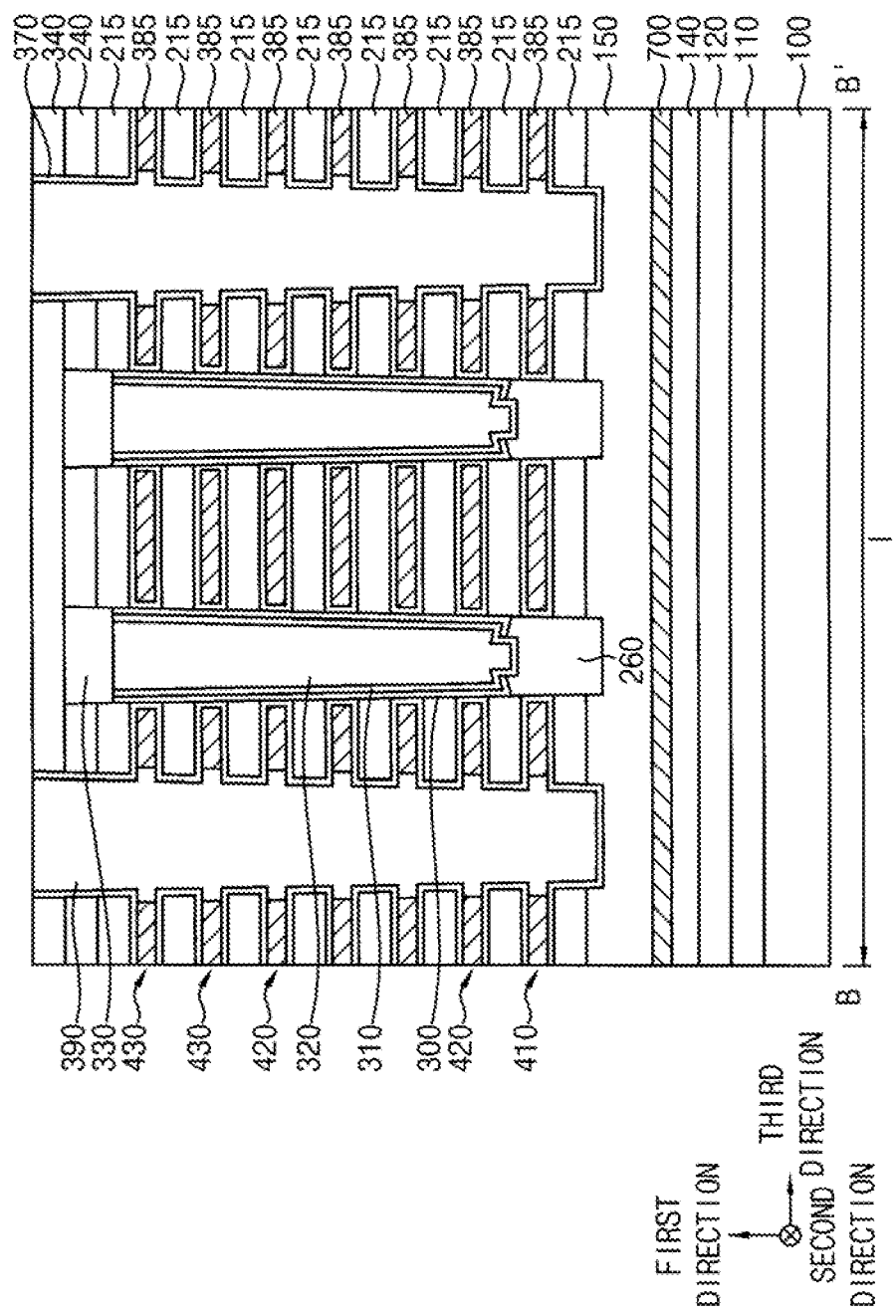
Figure 26:
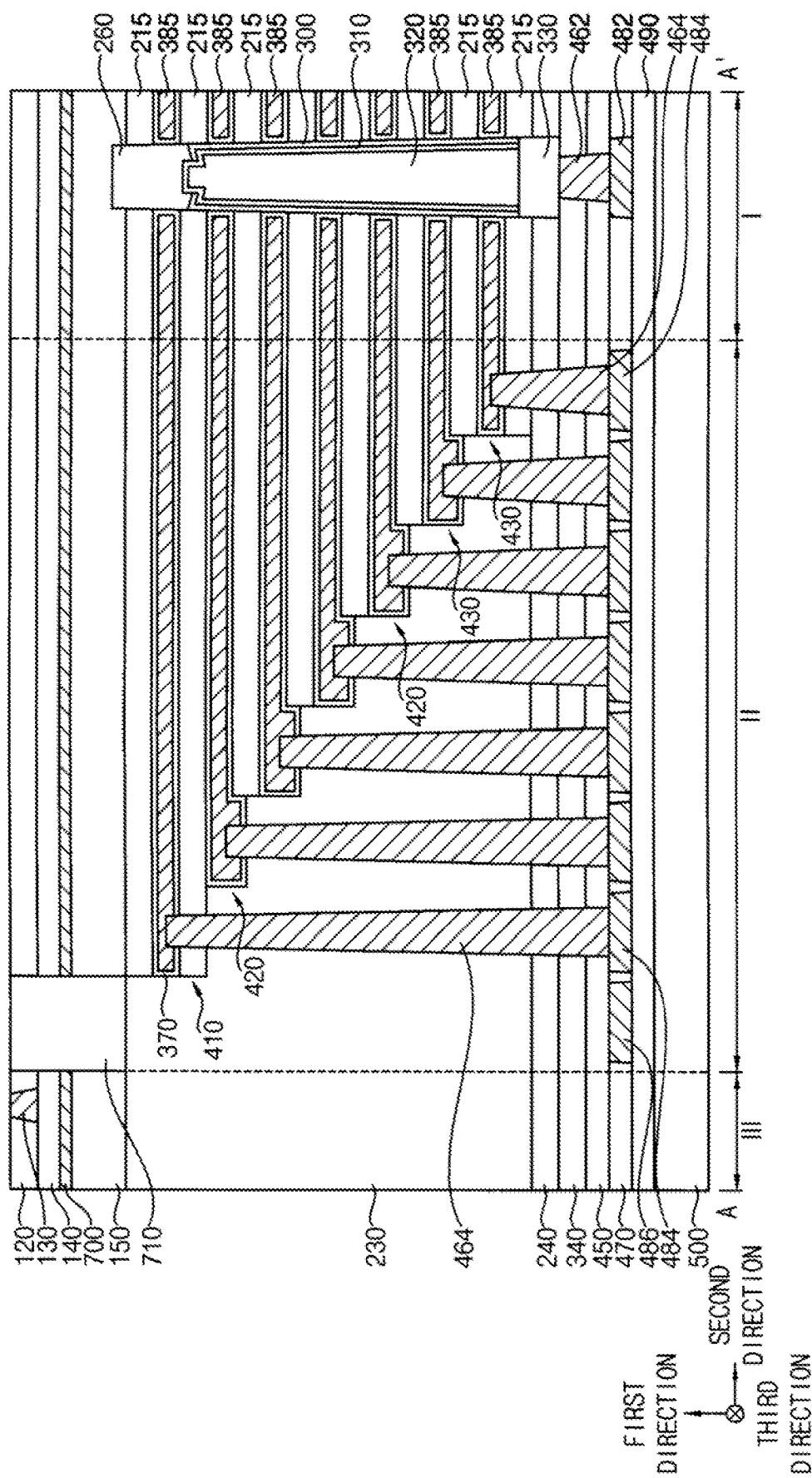
Figure 27:
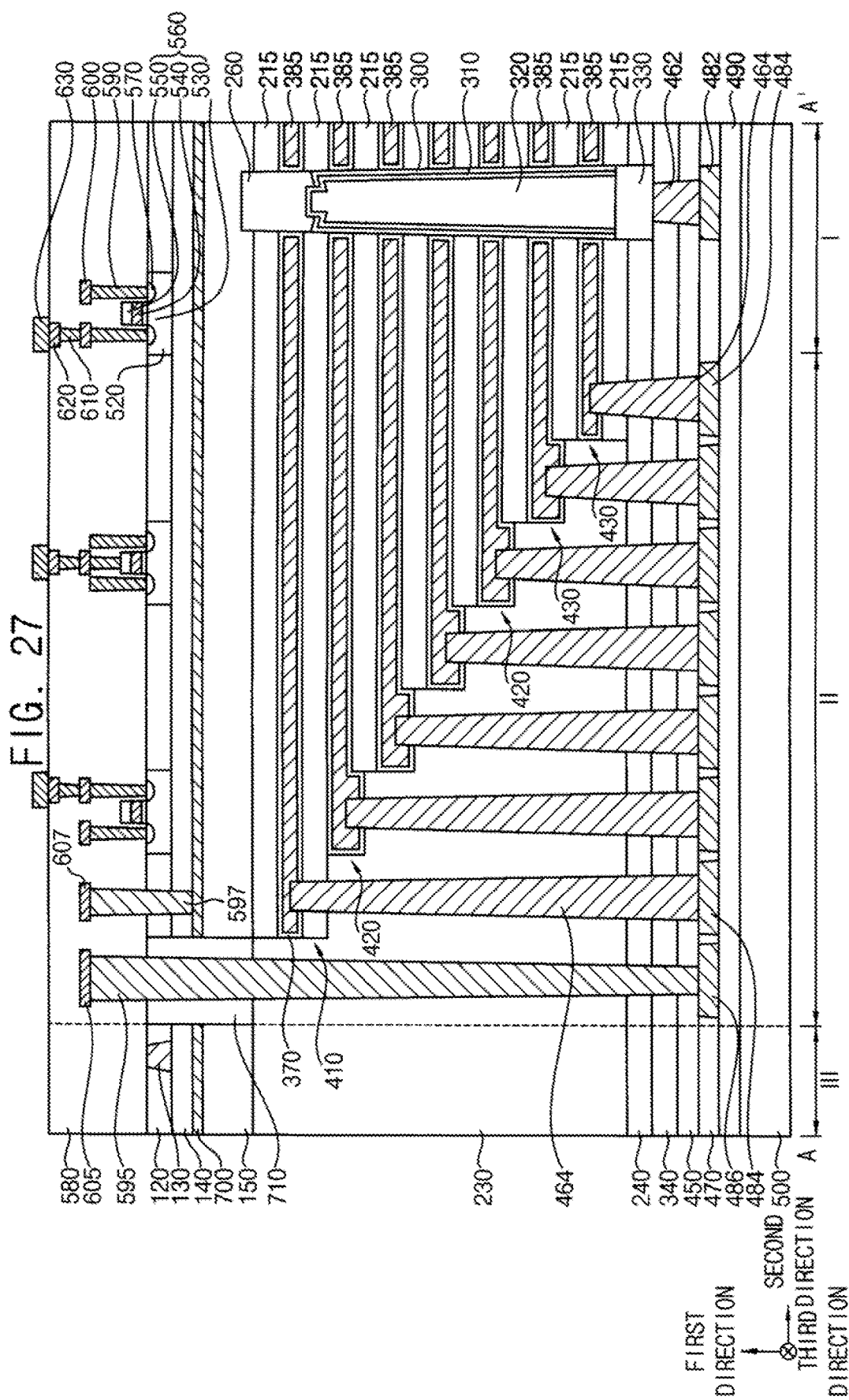
Figure 28:
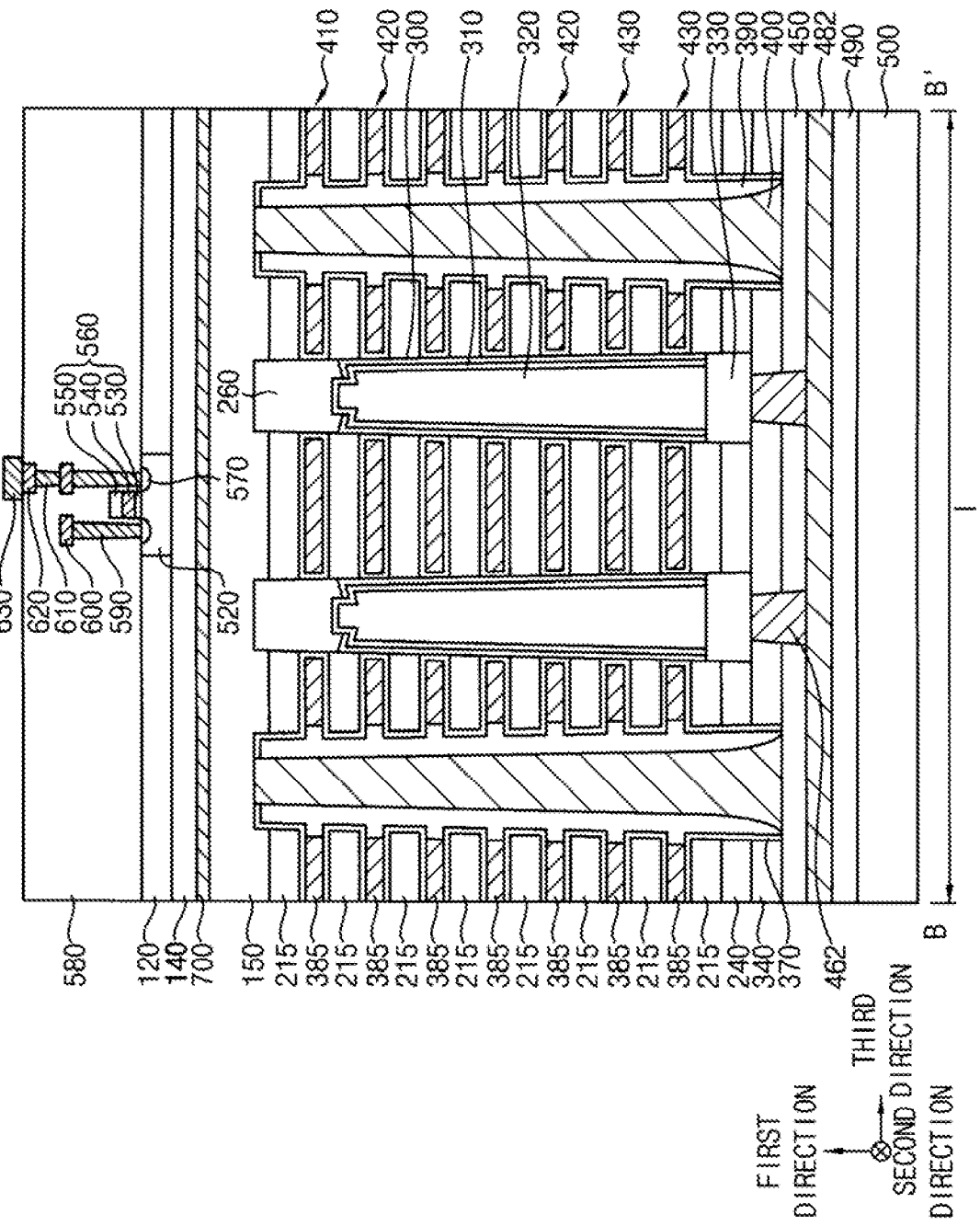

FIGS. 23 to 28 are cross-sectional views illustrating a method of manufacturing a vertical memory device in accordance with an example embodiment of the present inventive concept. Specifically, FIGS. 23 and 25 to 27 are cross-sectional views taken along lines A-A', respectively, and FIGS. 24 and 28 are cross-sectional views taken along lines B-B', respectively.

This method of manufacturing the vertical memory device may include processes substantially the same as or similar to the processes described with reference to FIGS. 1 to 22, and thus detailed descriptions thereon are omitted herein.

Referring to FIG. 23, processes substantially the same as or similar to the processes described with reference to FIGS. 1 and 2 may be performed. However, a CSL plate 700 may be further formed between the insulating buffer layer 140 and the semiconductor layer 150.

The CSL plate 700 may include a metal silicide, e.g., tungsten silicide ($WSi_2$).

Referring to FIG. 24, processes substantially the same as or similar to the processes described with reference to FIGS. 3 to 14 may be performed. However, the second spacer 390 may fully fill the first opening 350, and no first CSL 400 may be formed. Also, no first impurity region 155 may be formed at the upper portion of the semiconductor layer 150 adjacent to the first opening 350.

Figure 25:
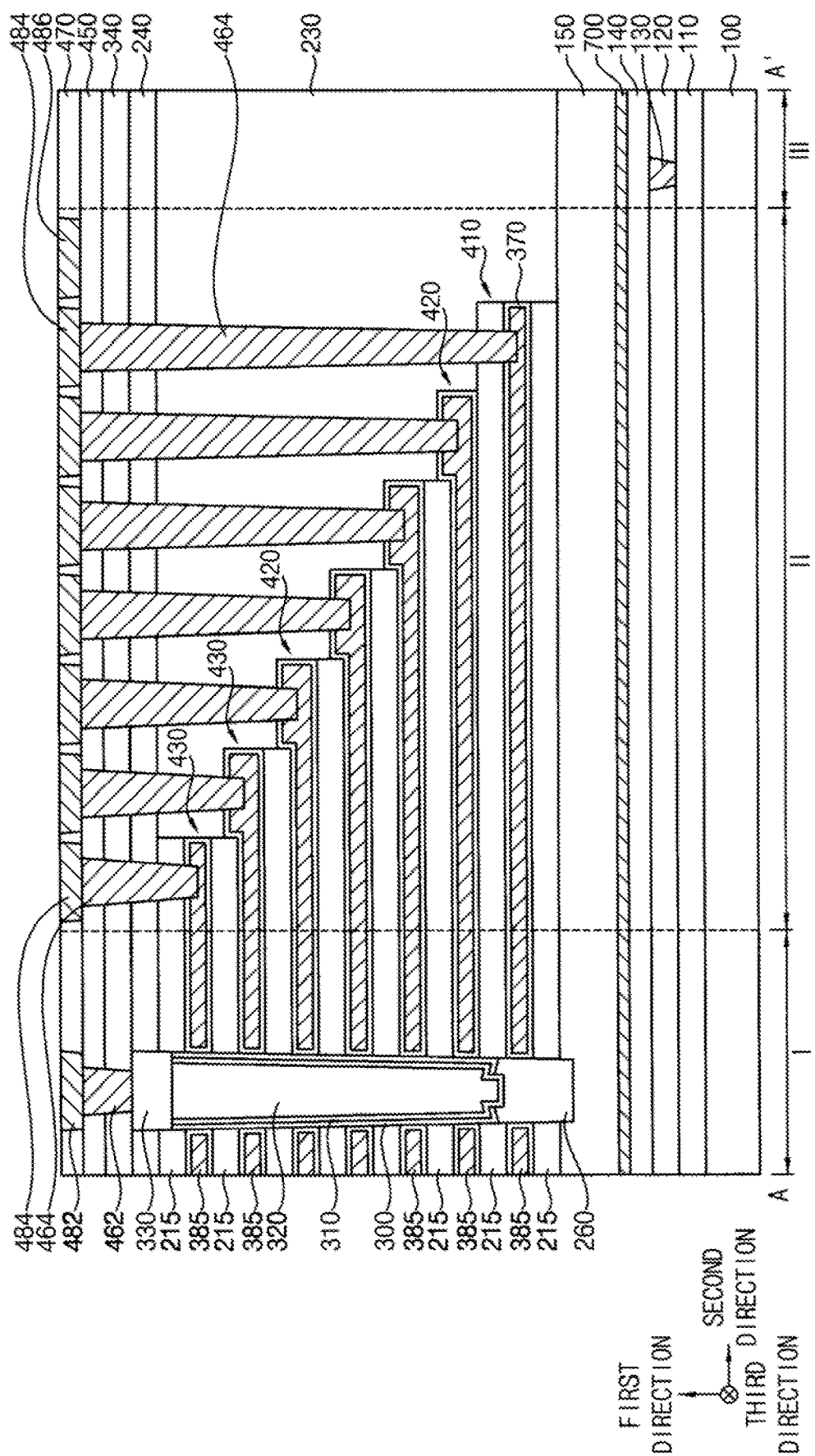

Referring to FIG. 25, processes substantially the same as or similar to the processes described with reference to FIGS. 15 to 17 may be performed. As described above, the CSL plate 700 may be formed between the insulating buffer layer 140 and the semiconductor layer 150.

Referring to FIG. 26, processes substantially the same as or similar to the processes described with reference to FIGS. 18 and 19 may be performed.

After forming a second opening by removing edge portions of the semiconductor layer 150, the CSL plate 700, the insulating buffer layer 140 and the second single crystalline silicon layer 120, respectively, in the second region II adjacent to the third region III, a second insulation pattern 710 may be formed to fill the second opening.

In an example embodiment of the present inventive concept, the second insulation pattern 710 may not overlap the staircase shape structure including the first to third gate electrodes 410, 420 and 430 in the first direction. The second insulation pattern 710 may include an oxide, e.g., silicon oxide ($SiO_2$).

Referring to FIG. 27, processes substantially the same as or similar to the processes described with reference to FIGS. 20 to 22 may be performed to complete the fabrication of the vertical memory device.

A ninth wiring 607 may be further formed on a seventh contact plug 597 which may extend through a lower portion of the seventh insulating interlayer 580, the second single crystalline silicon layer 120 and the insulating buffer layer 140 to contact an upper surface of the CSL plate 700. A width of the seventh contact plug 597 may gradually decrease from a top toward a bottom thereof in the first direction.

The sixth contact plug 595 may extend in the first direction through the second insulation pattern 710 between the first insulating interlayer pattern 230 and the seventh insulating interlayer 580. For example, the sixth contact plug 595 may contact a bottom surface of the seventh wiring 605, extend in the first direction through a lower portion of the seventh insulating interlayer 580, the second insulation pattern 710, the first insulating interlayer pattern 230, and the second to fifth insulating interlayers 240, 340, 450 and 470, and contact the top surface of the third wiring 486 to electrically connect the seventh wiring 605 to the third wiring 486. Here, the seventh wiring 605 may be one of the upper wirings and the third wiring 486 may be one of the lower wirings. The first to third gate electrodes 410, 420 and 430 may be disposed between the upper wirings and the lower wirings.

Figure 29:
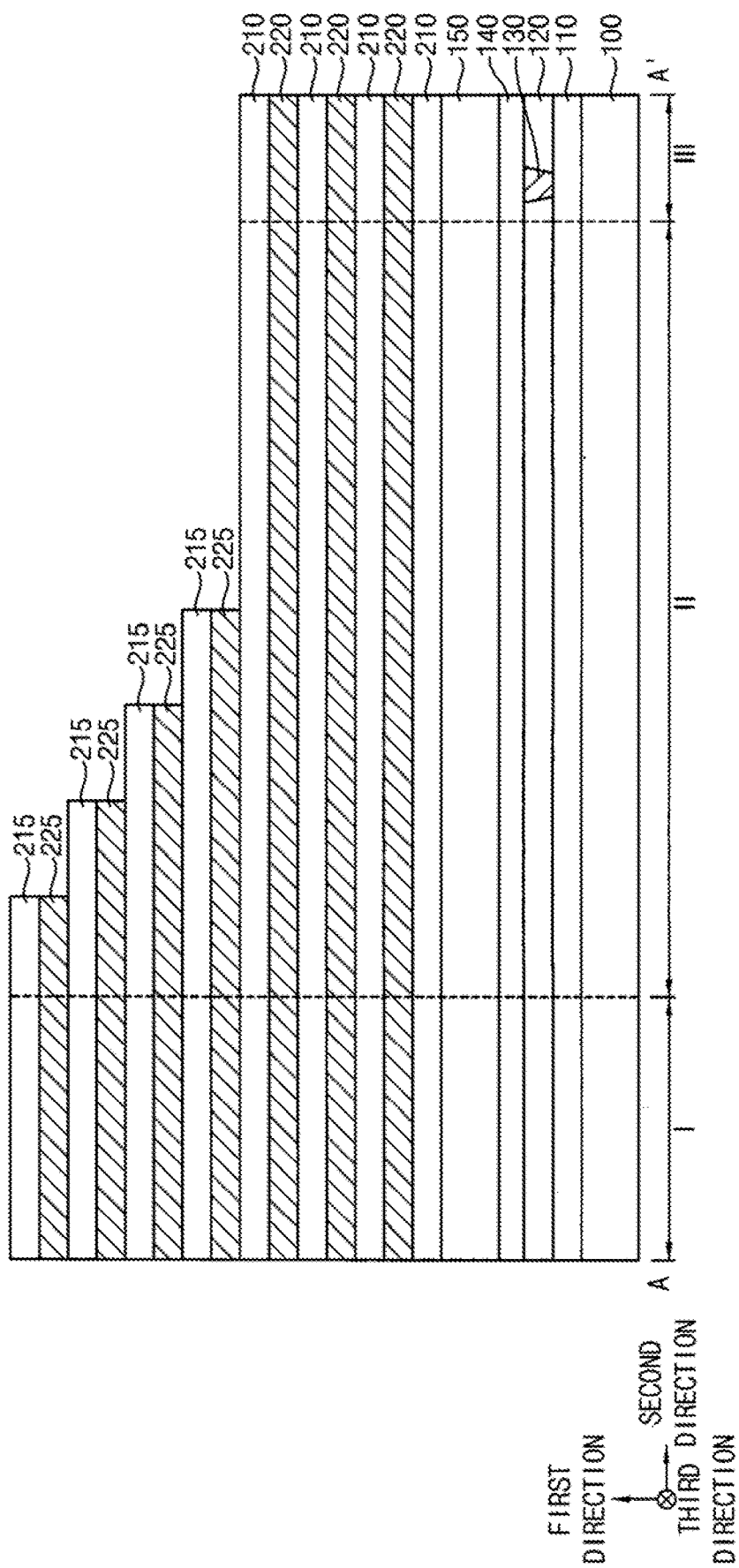
FIGS. 29 to 37 are cross-sectional views illustrating a method of manufacturing a vertical memory device in accordance with an example embodiment of the present inventive concept.
Figure 30:
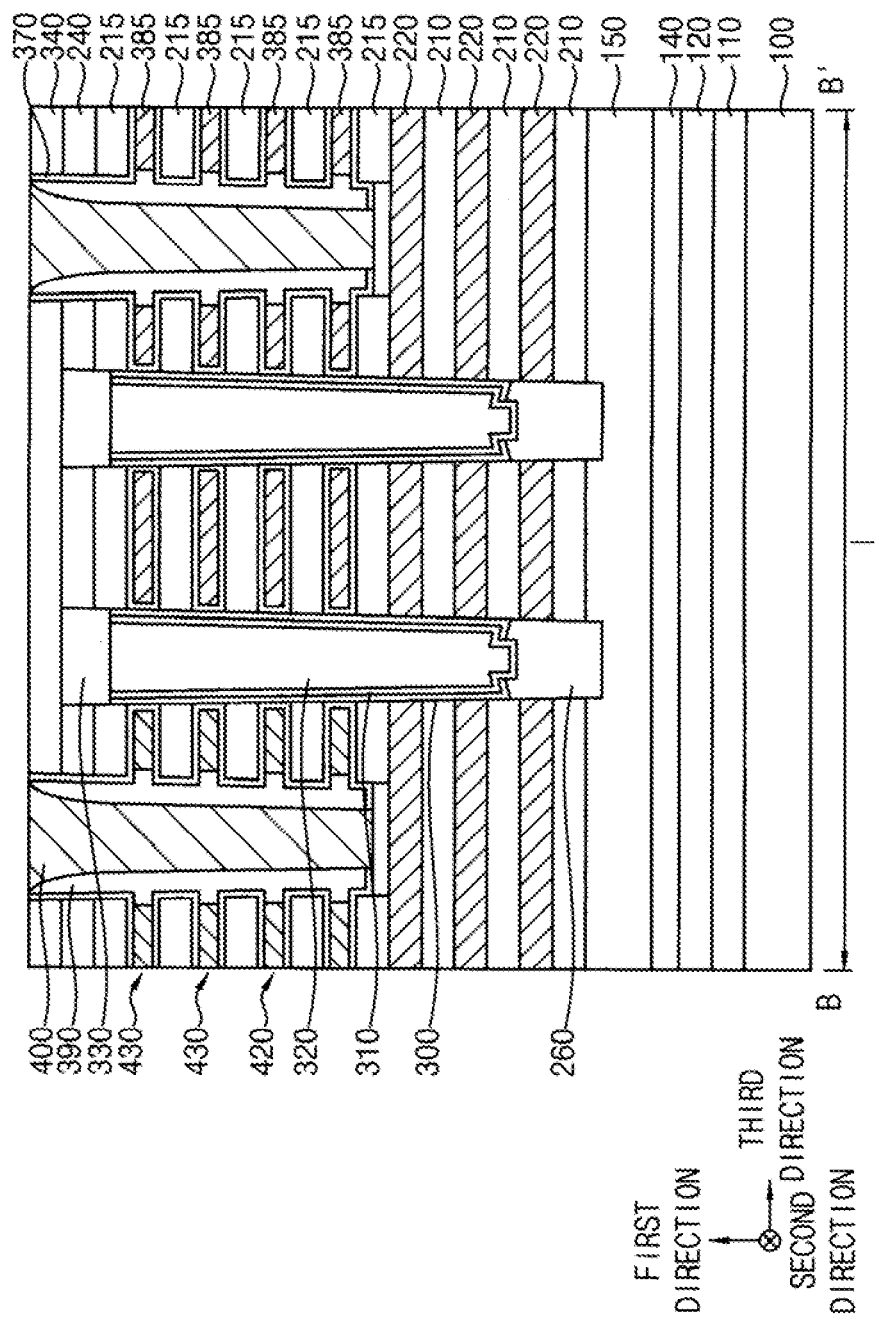
Figure 33:
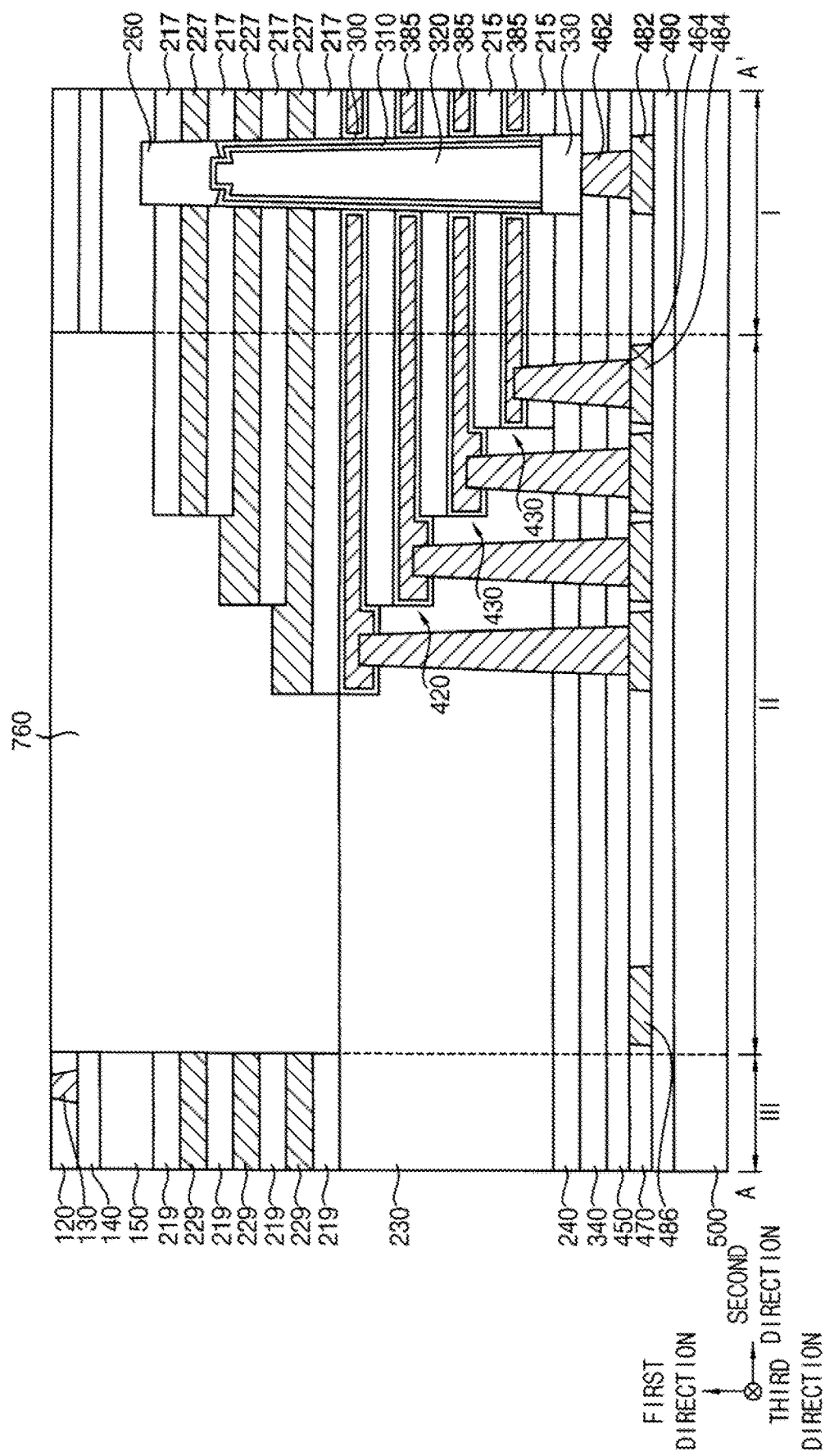
Figure 34:
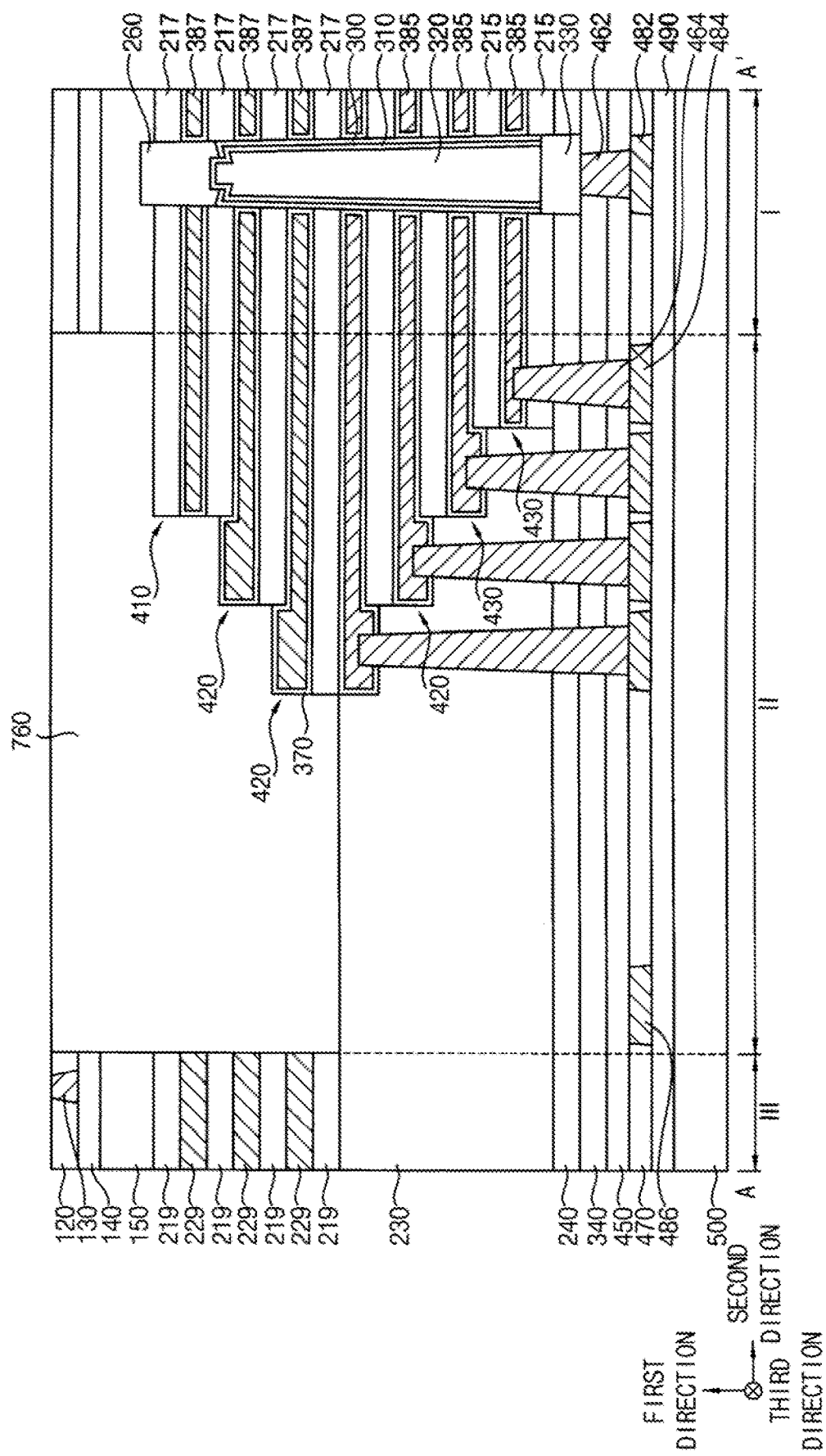
Figure 35:
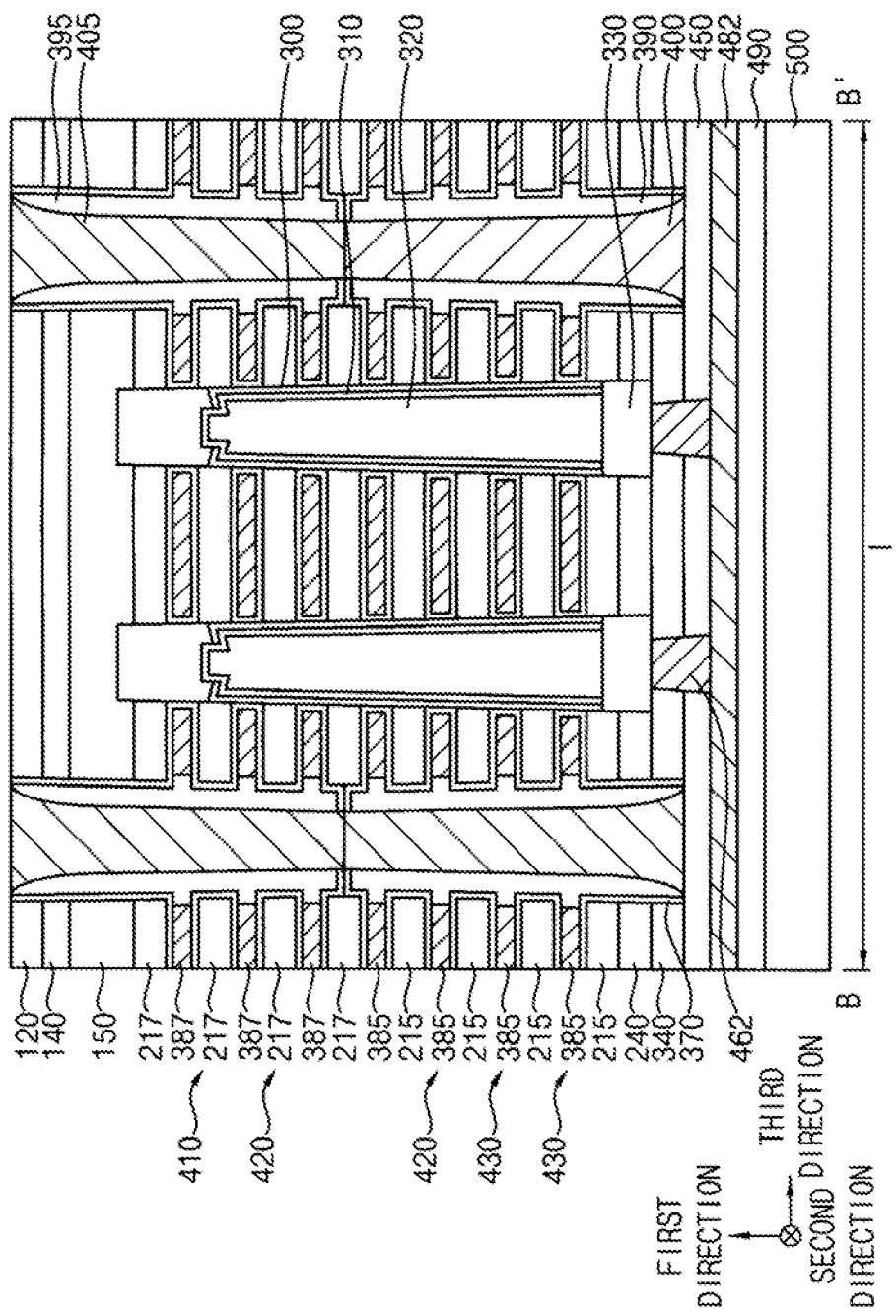
Figure 36:
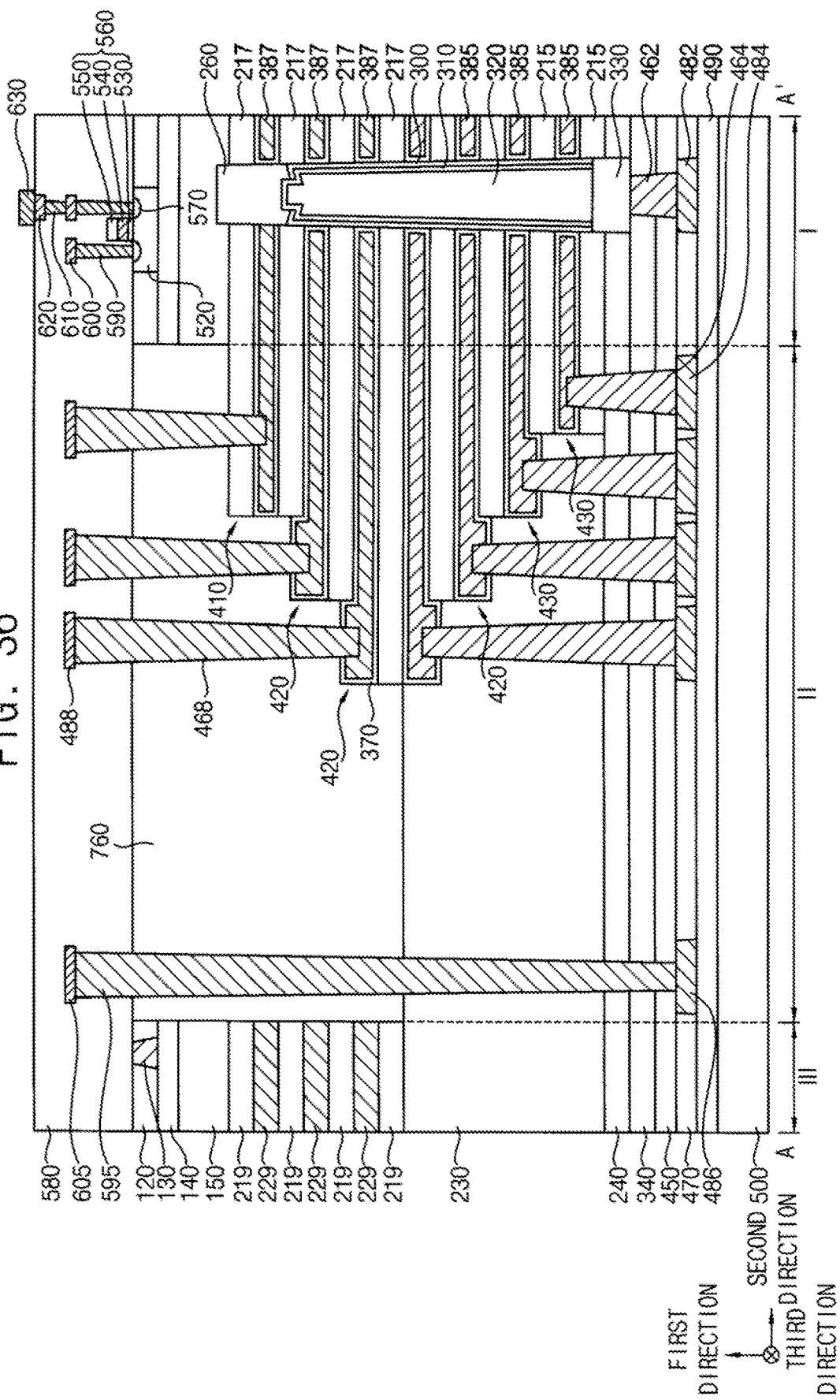
Figure 37:
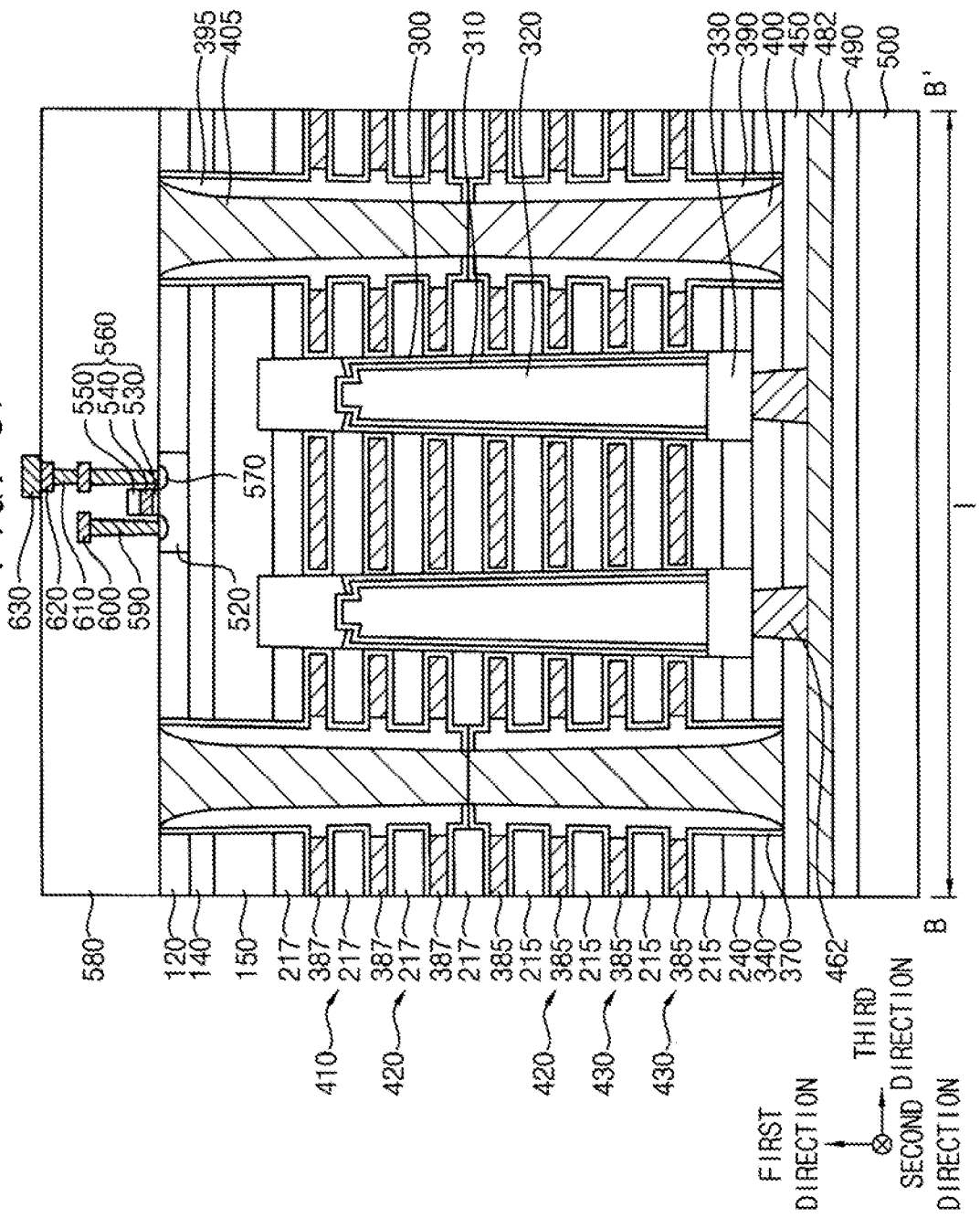

FIGS. 29 to 37 are cross-sectional views illustrating a method of manufacturing a vertical memory device in accordance with an example embodiment of the present inventive concept. Specifically, FIGS. 29, 31 to 34 and 36 are cross-sectional views taken along lines A-A', respectively, and FIGS. 30, 35 and 37 are cross-sectional views taken along lines B-B', respectively.

This method of manufacturing the vertical memory device may include processes substantially the same as or similar to the processes described with reference to FIGS. 1 to 22, and thus detailed descriptions thereon are omitted herein.

Referring to FIG. 29, processes substantially the same as or similar to the processes described with reference to FIGS. 1 to 4 may be performed. However, a mold of a staircase shape may not be formed by patterning all of the first insulation layers 210 and the sacrificial layers 220 sequentially stacked. On the other hand, a first mold may be formed by patterning ones of the first insulation layers 210 and ones of the sacrificial layers at relatively upper levels, respectively.

FIG. 29 shows that the first mold includes ones of the first insulation layers 210 and ones of the sacrificial layers 220 at four upper levels, respectively, however, the present inventive concept may not be limited thereto, and the first mold may include ones of the first insulation layers 210 and ones of the sacrificial layers 220 at a plurality of levels, respectively, other than at four levels.

Referring to FIG. 30, processes substantially the same as or similar to the processes described with reference to FIGS. 5 to 14 may be performed.

A bottom of the first opening 350 may be formed, for example, between a lower and an upper surfaces of one of the first insulation layers 210 (or the first insulating patterns 215) at a fifth level from above, and ones of the sacrificial layers 220 (or the first sacrificial patterns 225) exposed by the first opening 350, for example, only ones of the sacrificial layers 220 (or the first sacrificial patterns 225) from an uppermost level through a fourth level, may be removed to form the first conductive pattern 385.

The second spacer 390 and the first CSL 400 filling the first opening 350 may be formed. A width of the first CSL 400 may gradually decrease from a top toward a bottom thereof in the first direction.

Figure 31:
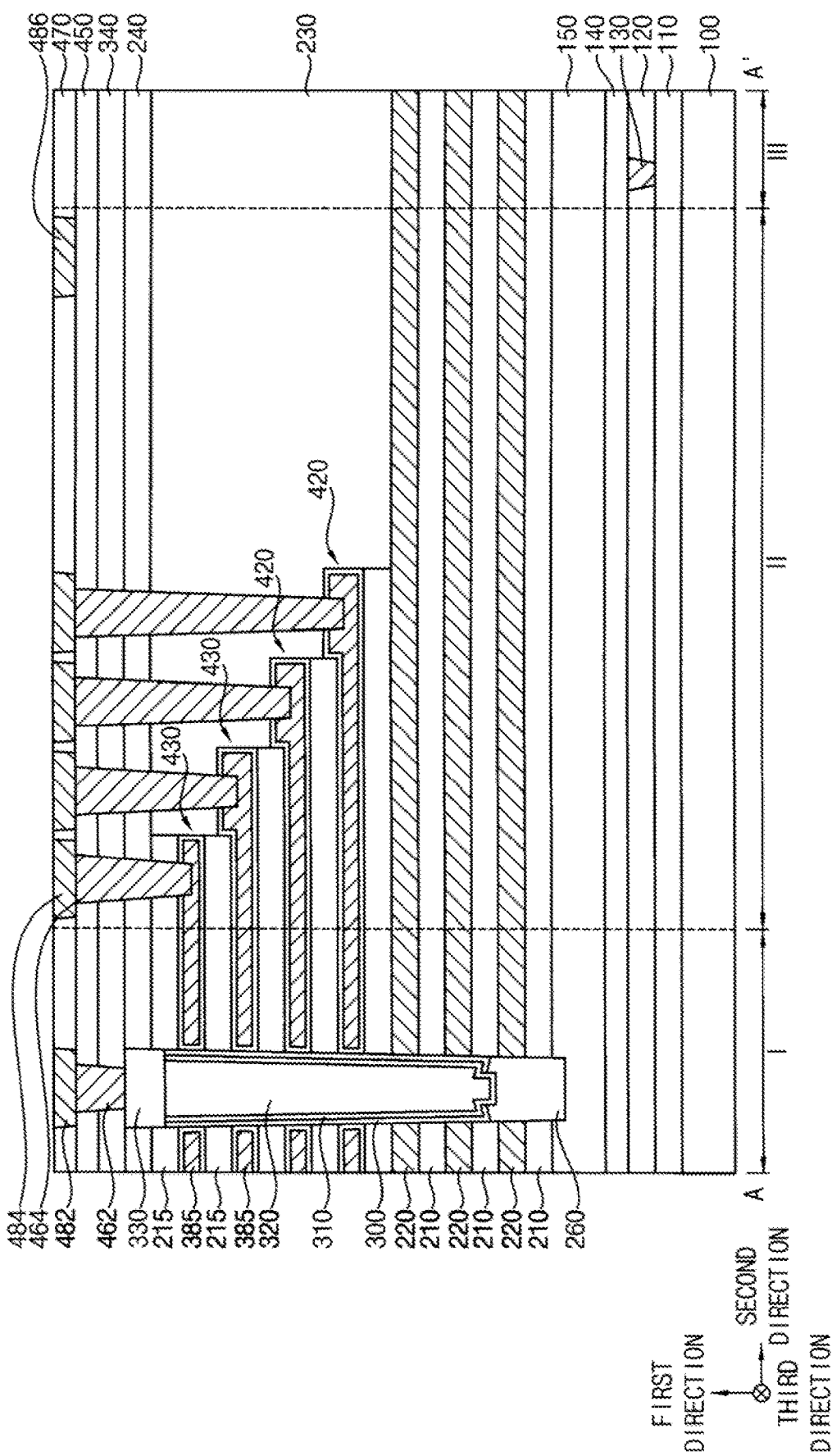

Referring to FIG. 31, processes substantially the same as or similar to the processes described with reference to FIGS. 15 to 17 may be performed. However, each of the second contact plugs 464 may be formed to contact an upper surface of the pad of each of the first conductive patterns 385, and may not contact an upper surface of each of the sacrificial layers 220 thereunder. An upper surface of each of the second contact plugs 464 may be substantially coplanar with an upper surface of the first contact plug 462 which extends in the first direction above the first and second channels 260 and 310.

In an example embodiment of the present inventive concept, the second contact plugs 464 having extension lengths in the first direction gradually increase according to an increase of respective distances of the second contact plugs 464 from the first and second channels 260 and 310.

Figure 32:
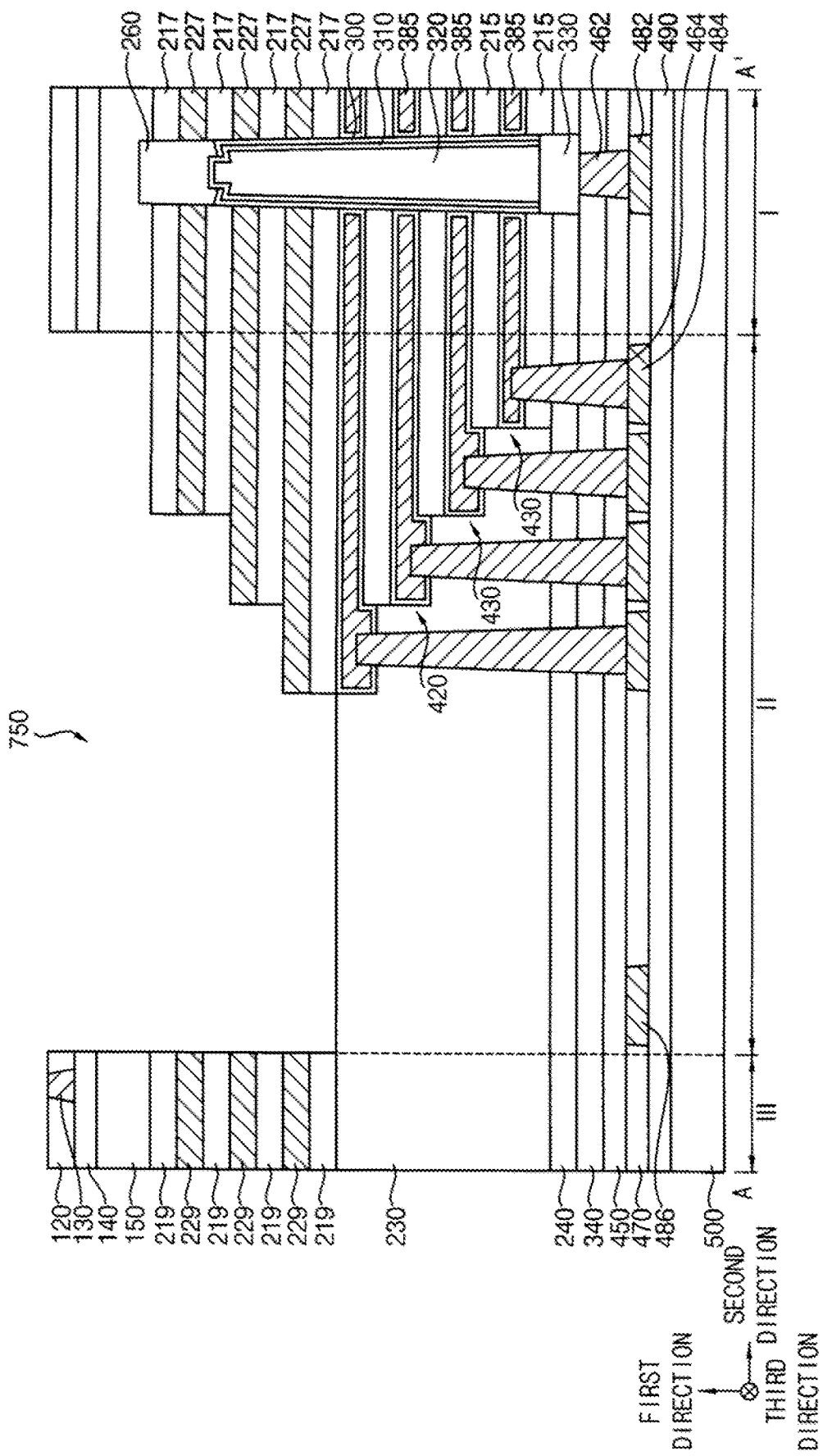

Referring to FIG. 32, processes substantially the same as or similar to the processes described with reference to FIGS. 18 and 19 may be performed. The substrate on which the structures are formed may be inverted using the handling substrate 500. Accordingly, hereinafter, upper and lower portions of the structures are referred to according as the directions shown in the drawing. Thus, lower surfaces of the second contact plugs 464 may be substantially coplanar with each other, and the lower surface of each of the second contact plugs 464 may be substantially coplanar with a lower surface of the first contact plug 462 which extends in the first direction under the first and second channels 260 and 310.

The first insulation layer 210 may be exposed by removing portions of the semiconductor layer 150, the insulating buffer layer 140 and the second single crystalline silicon layer 120 in the second region II, and a second mold having a staircase shape may be formed by performing processes substantially the same as or similar to the processes described with reference to FIG. 4.

Accordingly, a third opening 750 may be formed to expose the first insulating interlayer pattern 230 in the second region II, and the second mold may include steps each of which may include a third insulation pattern 217 and a second sacrificial pattern 227 sequentially stacked.

In an example embodiment of the present inventive concept, a lowermost step of the second mold may be formed to be aligned with an uppermost step of the first mold in the first direction. Also, a decreasing rate in the first direction of an extension length in the second direction from the lowermost step toward an uppermost step in the second mold may be substantially the same as a decreasing rate in the first direction of an extension length in the second direction from the uppermost step toward a lowermost step in the first mold, and thus the corresponding steps of the first and second molds may be aligned with each other in the first direction.

A fourth insulation pattern 219 and a third sacrificial pattern 229 may remain on the first insulating interlayer pattern 230 in the third region III.

Referring to FIG. 33, processes substantially same as or similar to the processes described with reference to FIG. 5 may be performed, and thus a thickness in the second direction of an end portion of at least one of the second sacrificial patterns 227 may increase, so that an upper surface of the end portion may be higher than those of other portions. FIG. 33 shows that increased thicknesses of end portions of ones of the second sacrificial patterns 227 at all levels except for an uppermost level, however, the present inventive concept may not be limited thereto. For example, the thicknesses of the end portions of all second sacrificial patterns 227 may be increased.

An eighth insulating interlayer pattern 760 may be formed to fill the third opening 750. The eighth insulating interlayer pattern 760 may include an oxide, e.g., silicon oxide ($SiO_2$), and thus may be merged with the first insulating interlayer pattern 230.

Referring to FIGS. 34 and 35, processes substantially the same as or similar to the processes described with reference to FIGS. 1 to 14 may be performed. Accordingly, a fourth opening may be formed through the first insulation layers 210 (or the third insulation patterns 217) and the sacrificial layers 220 (or the second sacrificial patterns 227) at a position corresponding to the first opening 350, and ones of the sacrificial layers 220 (or the second sacrificial patterns 227) exposed by the fourth opening, for example, ones of the sacrificial layers 220 (or the second sacrificial patterns 227) from the uppermost level through the third level may be removed to form a second conductive pattern 387. The third insulation pattern 217 may be formed between the second conductive patterns 387.

The first and second conductive patterns 385 and 387 sequentially stacked in the first direction may include the first to third gate electrodes 410, 420 and 430. For example, the first gate electrode 410 may be formed at an uppermost level, the third gate electrodes 430 may be formed at a lowermost level and a level directly above the lowermost level, and the second gate electrodes 420 may be formed between the first and third gate electrodes 410 and 430.

A third spacer 395 and a second CSL. 405 filling the fourth opening may be formed. A width of the second CSL 405 may gradually decrease from a top toward a bottom thereof in the first direction.

In an example embodiment of the present inventive concept, the first and second CSLs 400 and 405 may be aligned with each other in the first direction, and may include substantially the same material. A lower surface of the first CSL 400 and an upper surface of the second CSL 405 may be in contact with each other. Accordingly, the first and second CSLs 400 and 405 may serve as one CSL structure. In an example embodiment of the present inventive concept, a width of the CSL structure may gradually decrease from a top toward a middle portion thereof in the first direction, and then may gradually increase from the middle portion toward a bottom thereof in the first direction.

A third impurity region may be further formed at a portion of the semiconductor layer 150 or a portion of the second single crystalline silicon layer 120 adjacent to the second CSL 405, and may be electrically connected to the second CSL 405.

Referring to FIGS. 36 and 37, processes substantially the same as or similar to the processes described with reference to FIGS. 20 to 22 may be performed to complete the fabrication of the vertical memory device.

An eighth contact plug 468 may be formed to contact an upper surface of each of the second conductive patterns 387, and a tenth wiring 488 may be formed on the eighth contact plug 468. Upper surfaces of the eighth contact plugs 468 may be substantially coplanar with each other, and the upper surface of the eighth contact plug 468 may be substantially coplanar with an upper surface of the fourth contact plug 590 which extends in the first direction on the second impurity region 570 to contact the second impurity region 570. The second impurity region 570 may be located at an upper portion of the substrate (i.e., the second single crystalline silicon layer 120) and adjacent to the gate structure 560.

The sixth contact plug 595 may serve as a through hole via (THV) which may be formed for electrical connection between the memory cell array and the transistors, and the third wiring 486 may serve as a landing pad for the sixth contact plug 595. The sixth contact plug 595 may extend in the first direction through the first insulating interlayer pattern 230 and the eighth insulating interlayer pattern 760 which cover sidewalls of the first to third gate electrodes 410, 420 and 430, and may have an upper surface substantially coplanar with the upper surface of the fourth contact plug 590 and a lower surface substantially coplanar with the lower surface of the first contact plug 462.

As described above, a staircase shape structure including gate electrodes may not be formed by one process but by a plurality of processes, for example, two processes, so that contact plugs having a high aspect ratio may be easily formed.

The vertical memory device manufactured by processes described above may have structural characteristics as below.

The second conductive patterns 387 may be sequentially stacked under the substrate, that is, the second single crystalline silicon layer 120, to be spaced apart from each other in the first direction, and may be arranged to have a staircase shape including steps of which extension lengths in the second direction substantially parallel to a lower surface of the second single crystalline silicon layer 120 may increase toward a lowermost level. The first conductive patterns 385 may be sequentially stacked under the second conductive patterns 387 to be spaced apart from each other in the first direction, and may be arranged to have a staircase shape including steps of which extension lengths in the second direction may decrease toward a lowermost level.

The first structure including first and second channels 260 and 310 may extend in the first direction through the first and second conductive patterns 385 and 387.

In an example embodiment of the present inventive concept, extension lengths in the second direction of the first and second conductive patterns 385 and 387 adjacent to each other in the first direction, for example, an extension length in the second direction of a lowermost one of the second conductive patterns 387 and an extension length in the second direction of an uppermost one of the first conductive patterns 385, may be substantially the same as each other.

In an example embodiment of the present inventive concept, an upper surface of an end portion, that is, an upper surface of a pad in the second direction of at least one of the second conductive patterns 387, may be higher than upper surfaces of other portions thereof, and a lower surface of an end portion, that is, a lower surface of a pad in the second direction of at least one of the first conductive patterns 385, may be lower than lower surfaces of other portions thereof.

In an example embodiment of the present inventive concept, an increasing rate of the extension length in the second direction from an uppermost one to a lowermost one of the second conductive patterns 387 may be substantially the same as a decreasing rate of the extension length in the second direction from an uppermost one to a lowermost one of the first conductive patterns 385.

In an example embodiment of the present inventive concept, a width of the eighth contact plug 468 contacting an upper surface of each of the second conductive patterns 387 may gradually decrease from a top toward a bottom thereof in the first direction, and a width of the second contact plug 464 contacting a lower surface of each of the first conductive patterns 385 may gradually increase from a top toward a bottom thereof in the first direction.

In an example embodiment of the present inventive concept, the eighth contact plugs 468 having extension lengths in the first direction gradually increase according to an increase of respective distances of the eighth contact plugs 468 from the first and second channels 260 and 310.

In an example embodiment of the present inventive concept, the second CSL 405 may extend in the second direction to separate the second conductive patterns 387 in the third direction, and a width of the second CSL 405 in the third direction may gradually decrease from a top toward a bottom thereof. Also, the first CSL 400 may extend in the second direction to separate the first conductive patterns 385 in the third direction, and a width of the first CSL 400 may gradually increase from a top toward a bottom thereof. The first and second CSLs 400 and 405 may be aligned with each other in the first direction, and may include substantially the same material.

Figure 38:
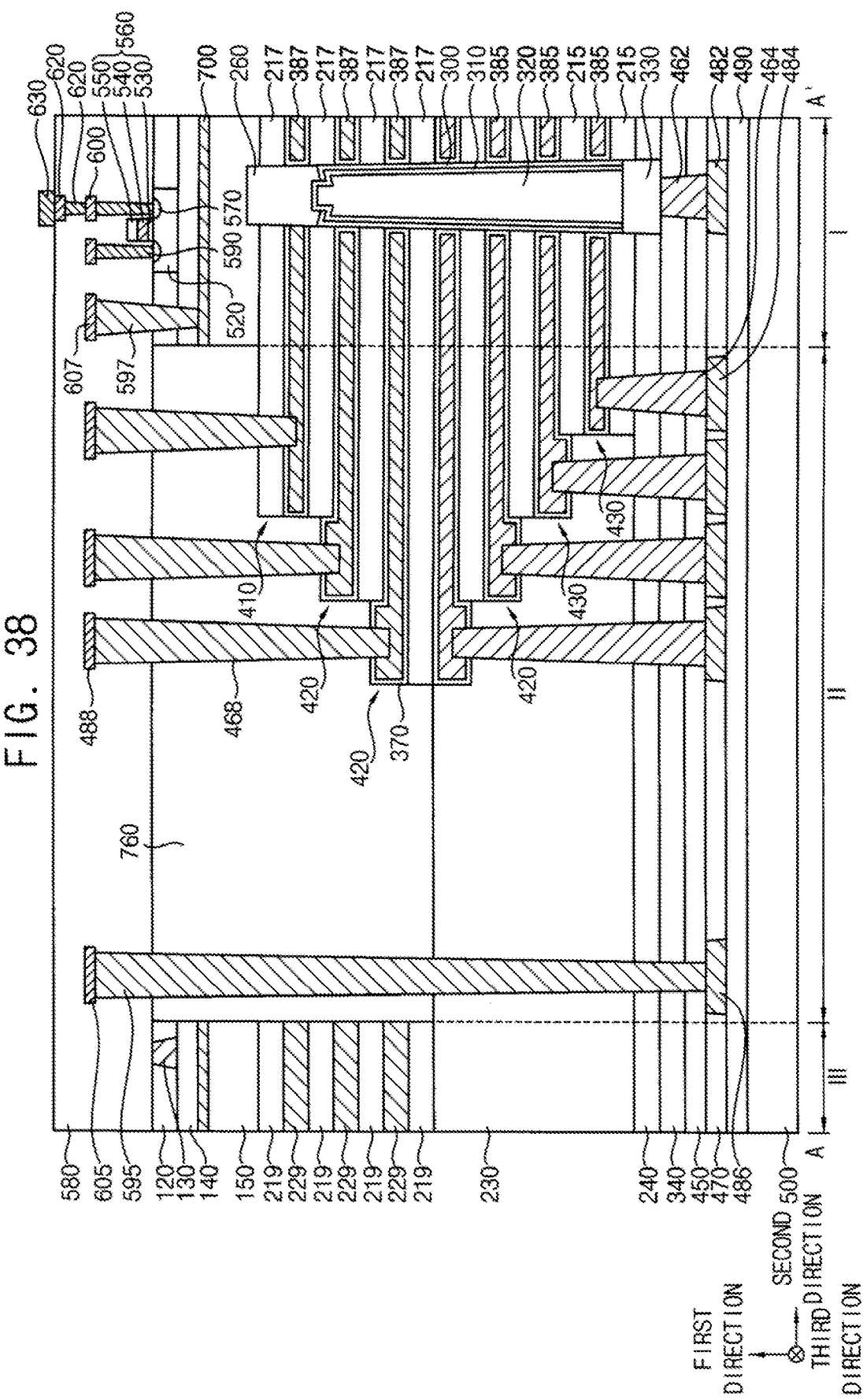
FIGS. 38 and 39 are cross-sectional views illustrating a vertical memory device in accordance with an example embodiment of the present inventive concept.
Figure 39:
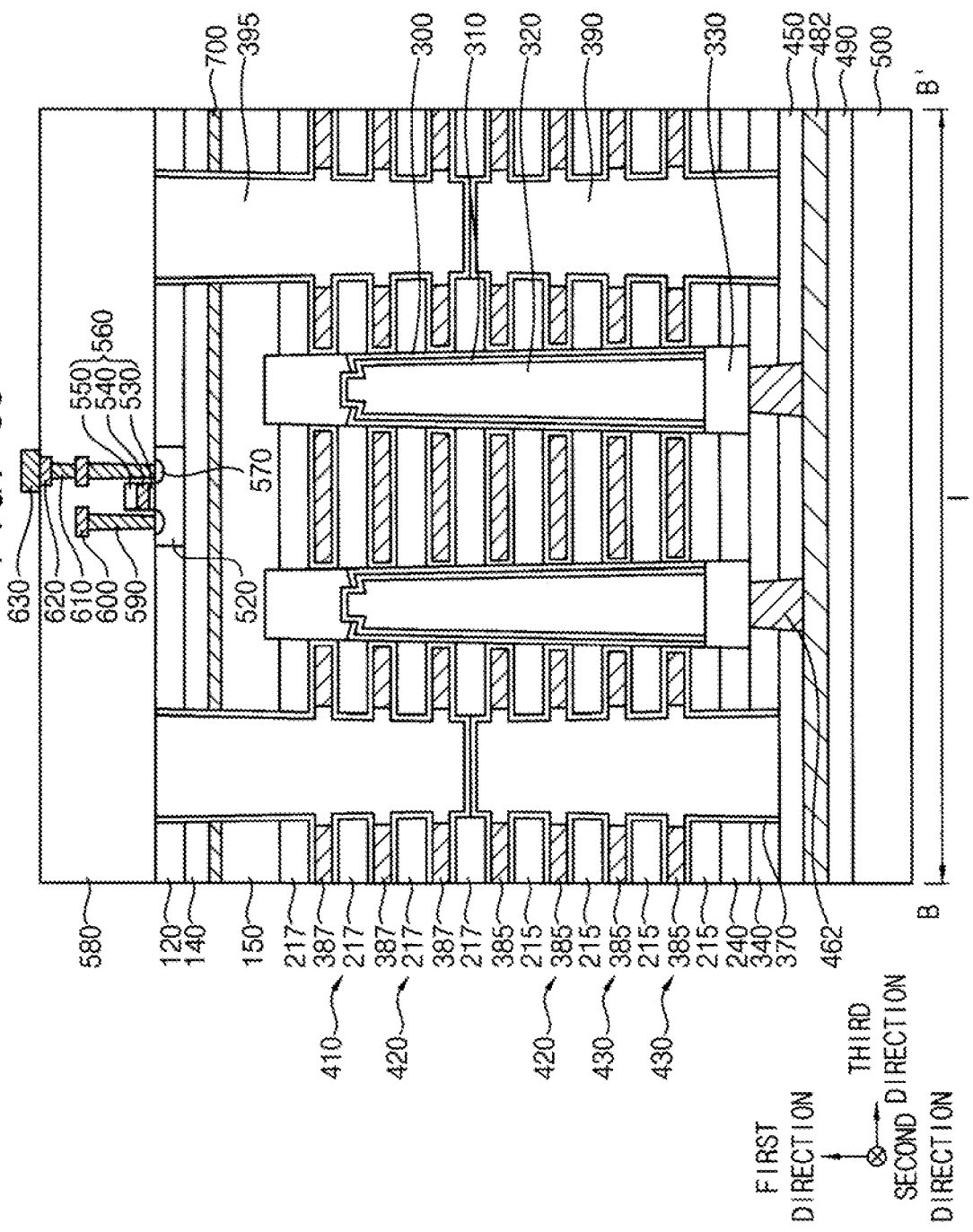

FIGS. 38 and 39 are cross-sectional views illustrating a vertical memory device in accordance with an example embodiment of the present inventive concept. Specifically, FIG. 38 is a cross-sectional view taken along line A-A', and FIG. 39 is a cross-sectional view taken along line B-B'.

This vertical memory device is a combination of the concept of the vertical memory device described with reference to FIGS. 23 to 28 and the concept of the vertical memory device described with reference to FIGS. 29 to 37. Accordingly, like reference numerals refer to like elements, and detailed descriptions thereon are omitted herein.

Referring to FIGS. 38 and 39, the CSL plate 700 may be formed between the semiconductor layer 150 and the insulating buffer layer 140, and no first and second CSLs 400 and 405 are formed, so that the second spacer 390 and the third spacer 395 may fill the first opening 350 and the fourth opening, respectively.

The seventh contact plug 597 contacting an upper surface of the CSL plate 700, and the ninth wiring 607 formed on the seventh contact plug 597 may be formed in the first region I instead of the second region II. For example, the seventh contact plug 597 may extend through a lower portion of the seventh insulating interlayer 580, the substrate, i.e., the second single crystalline silicon layer 120, and the insulating buffer layer 140 to contact the upper surface of the CSL plate 700.

As described above, although the present inventive concept has been described with reference to example embodiments, those skilled in the art will readily appreciate that many modifications are possible in the example embodiments without departing from the spirit and scope of the present inventive concept as defined by the appended claims.

What is claimed is:
1. A vertical memory device, comprising:
first gate electrodes spaced apart from each other under a substrate in a first direction substantially perpendicular to a lower surface of the substrate, the first gate electrodes being arranged to have a staircase shape including steps of which extension lengths in a second direction substantially parallel to the lower surface of the substrate gradually increase from an uppermost level toward a lowermost level;

second gate electrodes spaced apart from each other under the first gate electrodes in the first direction, the second gate electrodes being arranged to have a staircase shape including steps of which extension lengths in the second direction gradually decrease from an uppermost level toward a lowermost level; and a channel extending through the first and second gate electrodes in the first direction.

2. The vertical memory device of claim 1, wherein an extension length in the second direction of a lowermost one of the first gate electrodes and an extension length in the second direction of an uppermost one of the second gate electrodes are substantially the same as each other.

3. The vertical memory device of claim 1, wherein an upper surface of an end portion in the second direction of at least one of the first gate electrodes is higher than upper surfaces of other portions thereof, and a lower surface of an end portion in the second direction of at least one of the second gate electrodes is lower than lower surfaces of other portions thereof.

4. The vertical memory device of claim 1, wherein an increasing rate of the extension lengths in the second direction of the first gate electrodes is substantially the same as a decreasing rate of the extension lengths in the second direction of the second gate electrodes.

5. The vertical memory device of claim 1, further comprising:
first contact plugs each extending in the first direction to contact an upper surface of each of the first gate electrodes, respectively; and
second contact plugs each extending in the first direction to contact a lower surface of each of the second gate electrodes, respectively.

6. The vertical memory device of claim 5, further comprising:
a gate structure disposed on the substrate;
an impurity region disposed at an upper portion of the substrate adjacent to the gate structure; and
a third contact plug extending in the first direction on the impurity region to contact the impurity region,
wherein an upper surface of each of the first contact plugs is substantially coplanar with an upper surface of the third contact plug.

7. The vertical memory device of claim 6, further comprising:
a fourth contact plug extending in the first direction under the channel,
wherein a lower surface of each of the second contact plugs is substantially coplanar with a lower surface of the fourth contact plug.

8. The vertical memory device of claim 7, further comprising:
a fifth contact plug extending in the first direction through an insulating interlayer covering sidewalls of the first and second gate electrodes, the fifth contact plug having an upper surface substantially coplanar with the upper surface of the third contact plug and a lower surface substantially coplanar with the lower surface of the fourth contact plug.

9. The vertical memory device of claim 1, further comprising:
a first common source line (CSL) extending in the second direction to separate the first gate electrodes in a third direction substantially parallel to the lower surface of the substrate and substantially perpendicular to the second direction, the first CSL having a width in the third direction gradually decreasing from a top toward a bottom thereof; and
a second common source line (CSL) extending in the second direction to separate the second gate electrodes in the third direction, the second CSL having a width in the third direction gradually increasing from a top toward a bottom thereof.

10. The vertical memory device of claim 9, wherein a lower surface of the first CSL and an upper surface of the second CSL are in contact with each other, and the first and second CSLs include substantially a same material.

11. The vertical memory device of claim 1, further comprising:
a polysilicon layer disposed on the first gate electrodes;
a CSL plate disposed on the polysilicon layer;
an insulating buffer layer disposed on the CSL plate and under the substrate;
an insulating interlayer covering an upper surface of the substrate; and
a sixth contact plug extending through the insulating interlayer, the substrate and the insulating buffer layer to contact the CSL plate.

12. A vertical memory device, comprising:
first gate electrodes spaced apart from each other under a substrate in a first direction substantially perpendicular to a lower surface of the substrate;
second gate electrodes spaced apart from each other under the first gate electrodes in the first direction;
a channel extending through the first and second gate electrodes in the first direction;
first contact plugs each extending in the first direction and contacting an upper surface of each of the first gate electrodes, respectively, the first contact plugs having extension lengths in the first direction gradually increasing according to an increase of respective distances of the first contact plugs from the channel; and
second contact plugs each extending in the first direction and contacting a lower surface of each of the second gate electrodes, respectively, the second contact plugs having extension lengths in the first direction gradually increasing according to an increase of respective distances from the channel.

13. The vertical memory device of claim 12, wherein an increasing rate of the extension lengths in the first direction of the respective first contact plugs is substantially the same as an increasing rate of the extension lengths in the first direction of the respective second contact plugs.

14. The vertical memory device of claim 12, wherein upper surfaces of the first contact plugs are substantially coplanar with each other, and lower surfaces of the second contact plugs are substantially coplanar with each other.

15. The vertical memory device of claim 12, wherein a width of each of the first contact plugs gradually decreases from a top toward a bottom thereof, and a width of each of the second contact plugs gradually increases from a top toward a bottom thereof.

16. The vertical memory device of claim 15, wherein a width of the channel gradually increases from a top toward a bottom thereof.

17. The vertical memory device of claim 12, further comprising:
a first common source line (CSL) extending in a second direction substantially parallel to the lower surface of the substrate and separating the first gate electrodes in a third direction substantially parallel to the lower surface of the substrate and substantially perpendicular to the second direction, the first CSL having a width in the third direction gradually decreasing from a top toward a bottom thereof; and a second common source line (CSL) extending in the second direction, contacting the first CSL in the first direction, and separating the second gate electrodes in the third direction, the second CSL having a width in the third direction gradually increasing from a top toward a bottom thereof.

18. A vertical memory device, comprising:

gate electrodes spaced apart from each other under a substrate in a first direction substantially perpendicular to a lower surface of the substrate, the gate electrodes being arranged to have a staircase shape of which extension lengths of the gate electrodes in a second direction substantially parallel to the lower surface of the substrate gradually decrease from an uppermost level toward a lowermost level, and a lower surface of an end portion in the second direction of at least one of the gate electrodes being lower than lower surfaces of other portions thereof;

a channel extending through the gate electrodes in the first direction, the channel having a width gradually increasing from a top toward a bottom thereof;

first contact plugs each extending in the first direction to contact a lower surface of each of the gate electrodes, respectively, and having a width gradually increasing from a top toward a bottom thereof;

lower wirings electrically connected to the first contact plugs;

upper wirings disposed on the substrate; and a second contact plug extending in the first direction to be electrically connected to the upper wirings and the lower wirings, the second contact plug having a width gradually decreasing from a top toward a bottom thereof.

19. The vertical memory device of claim 18, further comprising:

a common source line (CSL) extending in the second direction and separating the gate electrodes in a third direction substantially parallel to the lower surface of the substrate and substantially perpendicular to the second direction, the CSL having a width in the third direction gradually increasing from a top toward a bottom thereof.

20. The vertical memory device of claim 18, further comprising:

a polysilicon layer disposed on the gate electrodes;

a CSL plate disposed on the polysilicon layer;

an insulating buffer layer disposed on the CSL plate and under the substrate;

an insulating interlayer covering an upper surface of the substrate; and a third contact plug extending through the insulating interlayer, the substrate and the insulating buffer layer to contact the CSL plate; the third contact plug having a width gradually decreasing from a top toward a bottom thereof.

* * * * *